(12) United States Patent
Matsubara et al.

(10) Patent No.: US 6,509,651 B1
(45) Date of Patent: Jan. 21, 2003

(54) SUBSTRATE-FLUORESCENT LED

(75) Inventors: Hideki Matsubara, Osaka (JP);
Toshihiko Takebe, Osaka (JP);
Kensaku Motoki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/351,323

(22) Filed: Jul. 12, 1999

(30) Foreign Application Priority Data

Jul. 28, 1998 (JP) .......................................... 10-212381
Nov. 13, 1998 (JP) .......................................... 10-323401

(51) Int. Cl.$^7$ ............................................. H01L 33/00
(52) U.S. Cl. .................... 257/891; 257/461; 257/607; 257/89; 257/98; 257/99; 257/100; 257/103; 257/309; 257/618; 257/647; 257/485; 257/200; 257/201; 257/463; 257/102; 313/498; 313/499; 313/500; 313/501; 313/502; 313/503; 313/504; 313/512
(58) Field of Search ................... 313/498, 499, 313/500, 501, 502, 503, 504, 512; 428/700, 690, 917; 257/103, 89, 463, 461, 607, 102, 200, 88

(56) References Cited

U.S. PATENT DOCUMENTS

| | | | | |
|---|---|---|---|---|
| 4,570,172 A | * | 2/1986 | Henry et al. ................... 357/17 |
| 5,198,690 A | * | 3/1993 | Kitagawa et al. ........... 257/200 |
| 5,644,156 A | * | 7/1997 | Suzuki et al. ................ 257/485 |
| 6,084,250 A | * | 7/2000 | Justel et al. .................... 257/89 |
| 6,337,536 B1 | * | 1/2002 | Matsubara et al. ......... 313/498 |

FOREIGN PATENT DOCUMENTS

| | | |
|---|---|---|
| EP | 0 486 052 | 5/1992 |
| EP | 0 971 421 | 1/2000 |
| JP | 10-56203 | 2/1998 |

OTHER PUBLICATIONS

Patent Abstracts of Japan, vol. 1998, No. 06, Apr. 30, 1998.
Patent Abstracts of Japan, vol. 007, No. 280 (E–216), Dec. 14, 1983.
Nakamura, Shuji et al. "InGaN Single QW LEDs" *The Blue Laser Diode: GaN Based Light Emitters and Lasers*, Preface and pp. 216–221, Springer–Verlag Berlin, Heidelberg, New York, 1997.

* cited by examiner

*Primary Examiner*—Nathan J. Flynn
*Assistant Examiner*—Fazli Erdem
(74) *Attorney, Agent, or Firm*—Smith, Gambrell & Russell, LLP

(57) ABSTRACT

A substrate-fluorescent LED having a fluorescent-impurity doped substrate and an epitaxial emission structure including an active layer and being made on the substrate. The epitaxial emission structure emits blue or green light corresponding to the band gap of the active layer. The substrate absorbs a part of the blue or green light and makes fluorescence of a longer wavelength. Neutral color light or white light is emitted from the LED. The fluorescent substrate is n-AlGaAs(Si dope), GaP(Zn+O dope), ZnSe(Cu+I, Ag+I, Al+I dope), GaN(O.C.Va(N) dope) or so.

20 Claims, 16 Drawing Sheets

B···blue(green) light from the epitaxial emission structure
Y···SA emission from the substrate absorbing blue(green) light

EMBODIMENT 1 ( α, β )

α : d = 50 μm
β : d =200 μm

EMBODIMENT 1 ( α, β )

EMBODIMENT 2 ($\gamma, \delta$)
ZnSe / ZnSe (I, Al)

$\delta : 5 \times 10^{18} cm^{-3}$
$\gamma : 1 \times 10^{17} cm^{-3}$

EMBODIMENT 2 ($\gamma, \delta$)
ZnSe / ZnSe (I, Al)

EMBODIMENT 3 ( ε , ζ )

ZnSSe·ZnCdSe / AlGaAs (Si)

Cd ratios ( ε , ζ )in ZnCdSe   ε=0.30
ζ=0.40

EMBODIMENT 3 ( ε , ζ )

ZnSSe·ZnCdSe / AlGaAs (Si)

EMBODIMENT 4 ( η )

GaInN / GaP (Zn,O)

| |
|---|
| p-type GaN contact layer    55 |
| p-type AlGaN cladding layer    54 |
| GaInN active layer    53 |
| n-type AlGaN cladding layer    52 |
| n-type GaN contact layer    51 |
| semi-insulating GaP substrate    50 (Zn, O dope) |

EMBODIMENT 4 ( η )
GaInN / GaP ( Zn, O )

EMBODIMENT 4 ( η )

| embodiment | 1 | α β | ZnSe·ZnCdSe/ZnSe(I,Cu) |
|---|---|---|---|
|  | 2 | γ δ | ZnSe/ZnSe(I,Al) |
|  | 3 | ε ζ | ZnSSe·ZnCdSe/AlGaAs(Si) |
|  | 4 | η | GaInN/GaP(Zn,O) |
|  | 6 | κ λ μ | GaInN/GaN(O,C,Va(N)) |

Fig. 18

| Embodiment number | | 1 | 2 | 3 | 4 | 5 | 6 |
|---|---|---|---|---|---|---|---|
| Substrate emission | Substrate | I,Cu–ZnSe | Al,I–ZnSe | Si–AlGaAs | Zn,O–GaP | O·C·Va(N)–GaN | O·C·Va(N)–GaN |
| | Wavelength | 630nm | 600nm | 690nm | 700nm | 550nm | 580nm |
| Epi-layer emission | Active layer | ZnSe/ZnCdSe | ZnSe | ZnSSe/ZnCdSe | GaInN | GaInN | GaInN |
| | Wavelength | 480nm | 465nm | 520 nm / 550 nm | 520nm | 430nm | 460nm |
| Symbol | | α | β | γ | δ | ε | ζ | η | κ | λ | μ |
| Differences | | thickness 50 μm | thickness 200 μm | n 1×10$^{17}$ cm$^{-3}$ | n 5×10$^{18}$ cm$^{-3}$ | Cd 0.30 | Cd 0.40 | | thickness 100 μm | thickness 500 μm | thickness 1000 μm |
| Chromaticity | x | 0.34 | 0.50 | 0.34 | 0.50 | 0.47 | 0.57 | 0.45 | 0.29 | 0.35 | 0.42 |
| | y | 0.21 | 0.24 | 0.19 | 0.29 | 0.48 | 0.43 | 0.46 | 0.29 | 0.36 | 0.45 |
| Color | | pink | red-purple | bluish red-purple | yellowish pink | yellow | orange | yellow | white (bluish) | white (bluish) | white | white (yellowish) |

EMBODIMENT 5

EMBODIMENT 5

SUBSTRATE-FLUORESCENT LED

BACKGROUND OF THE INVENTION

1. Field of the Invention

This invention relates to a new LED which emits complex light with a spectrum having two peaks, in particular, relates to a single LED having a substrate and an active layer which produces neutral colors, e.g., pink, redpurple, orange, yellow or white color by synthesizing the band gap emission from the active layer and the fluorescence from the substrate.

This application claims the priority of Japanese Patent Applications No. 10-212381 (212381/1998) filed on Jul. 28, 1998 and No. 10-323401 (323401/1998) filed on Nov. 13, 1998, which are incorporated herein by reference.

2. Description of Prior Art

There are already various high luminous LEDs for emitting various monochromatic colors on sale. The LEDs having an active layer of AlGaAs or GaAsP are prevalent as red color LEDs. Red color LEDs emitting red light more than several candelas (Cd) are produced at a low cost. The LEDs emitting the colors other than red are also prevailing. Green-yellowgreen LEDs are produced by utilizing gallium phosphide (GaP) as an active layer. Blue LEDs are made by employing silicon carbide (SiC) as an active layer. Blue-green LEDs are produced on an active layer of gallium indium nitride (GaInN). Orange-yellow LEDs are also fabricated by employing aluminum gallium indium phosphide (AlGaInP) as an active layer. The green-yellowgreen GaP LEDs, blue SiC LEDs, blue-green GaInN LEDs and orange-yellow AlGaInP LEDs are pragmatic and low cost LEDs. In these LEDs, the substrates are GaAs, GaP, SiC, sapphire and so on.

The following are the relations between the monochromatic colors and the active layers of the LEDs on the market.
(1) red LED . . . AlGaAs, GaAsP
(2) green-yellowgreen LED . . . GaP
(3) blue LED . . . SiC
(4) blue-green LED . . . GaInN
(5) orange-yellow . . . AlGaInP All the prior LEDs make use of the emission produced by the band gap transition of electrons induced by an injection current. The wavelength of the emitted light is uniquely determined by the band gap obtained by a relation of $\lambda = hc/Eg$, where "$\lambda$" is the wavelength of the emitted light, "h" is Planck's constant, "c" is the light velocity and "Eg" is the band gap of the active layer. Since the light includes a single wavelength, the LEDs are all monochromatic. Since the recombination of a hole and an electron makes a photon (light quanta), the spectrum of the emitted light has a narrow peak at $\lambda = hc/Eg$.

The LEDs make primary colors (RGB) and several neutral colors. The neutral colors are still monochromatic colors having a single peak in the spectrum. The colors which the conventional LEDs can produce are red, orange, yellow, yellowgreen, green, bluegreen, blue, bluepurple and purple. These colors are primary colors (RGB), neutral colors between red and green or neutral colors between green and blue. Of course, the primary colors (RGB) are monochromatic. Besides, the neutral colors made by the current LEDs are essentially monochromatic colors. There is no LED which can produce the neutral colors between red and blue or the neutral colors among red, green and blue by a single LED structure.

An assembly of more than three LEDs emitting three primary colors (RGB) can make neutral colors. Any colors can be produced by assembling three primary color LEDs. However, an assembly of more than three different LEDs will complicate the LED structure and enhance the cost of the production.

The contrivance for integrating the colors into a uniform tone is also necessary. The purpose of the present invention is to provide a single LED which can make neutral colors.

Lightening and displaying require the light sources of neutral colors (e.g., redpurple, pink) between red and blue or the light sources of neutral colors (various tones of white) among red, blue and green in stead of monochromatic colors. Conventional LEDs are all monochromatic. Neutral colors are essential for lightening and displaying. Thus, fluorescent lamps or incandescent lamps are still used at present for illuminating or displaying.

The lightening or displaying light sources have the advantages of convenient handling and historical familiarity. Incandescent bulbs, fluorescent tubes or lamp apparatuses are cheap and easily obtainable. Incandescent lamps and fluorescent lamps can be directly driven by the commercial power sources. Incandescent lamps and fluorescent lamps enjoy the advantages of matured technology. However, incandescent lamps have a drawback of a short lifetime. Fragile filaments force us to renew the incandescent lamps frequently. Incandescent lamps are plagued with low lightening efficiency. Most of the power is consumed as heat. Having a longer lifetime, fluorescent lamps are suffering from bulky, long and heavy apparatuses.

LEDs have an advantage of high efficiency, since LEDs directly convert electric current into light. Another strong point of LEDs is a long lifetime. Light weight is a further merit of LEDs. LEDs are already used for displaying devices which demand only primary colors. However, the applications of LEDs to displays are still restricted, since white, redpurple and pink cannot be produced by current LEDs. At present, assembling a plurality of different color LEDs is an available solution of making neutral colors, which raises the cost through complicating the structure.

There is only a single trial of synthesizing white color by an LED. The trial makes a white color LED by assembling a high luminous blue LED having a GaInN active layer and a YAG (yttrium aluminum garnet) phosphor of yellow. The technology of making blue GaInN-LEDs by growing a GaN crystal on a sapphire substrate and growing a GaInN active layer on the GaN film has been established. The white LED is an application of the GaInN blue LEDs. The white LED was proposed by, Shuji Nakamura & Gerhard Fasol, "The Blue Laser Diode (GaN Based Light Emitters and Lasers)", January 1997, Springer, p 216–221(1997).

FIG. 1(a) and FIG. 1(b) show the proposed white LED. A GaN layer and a GaInN active layer are grown on the sapphire substrate. A blue LED chip 5 is bonded on a bottom of a cavity 4 of a stem 2. A p-electrode (anode) and an n-electrode (cathode) are on the upper surface of the LED, and these electrodes are connected with the stems 2 and 3 by wires. The cavity 4 is filled with a YAG phosphor 6 covering the GaInN blue LED 5. The YAG is a yellow phosphor which absorbs blue light and emits yellow light.

Conventional, ordinary LEDs or PDs adopt an (n-type or p-type) conductive substrate. The bottom of LEDs or PDs is an (n- or p-) electrode. The bottom electrode is bonded directly on the stem. Another electrode on the top is connected to another stem by a wire. The ordinary LED has only a single wire. But the GaInN blue light LED which consists of a GaN layer, a GaInN layer or so on an insulating sapphire substrate requires two (n- and p-) electrodes on the top, since the bottom of the LED chip is not an n-electrode at all. The blue light LED on the sapphire substrate makes use of two wires for connecting two top electrodes with the stems. When an electric current is injected from the anode via the chip to the cathode, the GaN-type (GaInN active layer) LED emits blue light. A part of the blue light from the LED passes the YAG phosphor 6 and goes out of the YAG pond 6 as blue light. The rest of the blue light is absorbed by the YAG 6. The YAG 6 converts the blue light to yellow light which has a longer wavelength. Yellow light and blue light are synthesized to white light. Namely, human eyes feel the unified color of the blue light from the GaN LED and the yellow light from the YAG as white.

The original LED light is a positive, inherent emission caused by the band gap transition of electrons. The fluorescent light is a passive parasitic emission induced by a fall of electrons to the ground state which have been lifted by the blue light via an excited state to an emission level in the phosphor. The emission levels make light of energy lower than the original blue LED emission. Thus, when an LED is enclosed with a phosphor, inherent light of the LED and fluorescent light of a longer wavelength are produced. The YAG emits yellow light in this case. The fluorescent yellow and the LED blue make white color. Among visible light, blue color has a short wavelength with high energy. The appearance of the blue GaInN-LED enables us to make the white YAG-LED.

FIG. 2 shows the emission spectrum of the proposed GaInN YAG-LED. The abscissa is the wavelength (nm) and the ordinate is the emission intensity (arbitrary unit). The spectrum has a sharp peak at 460 nm which is an inherent peak of the blue GaInN-LED. The spectrum has another broader peak at 550 nm which is the fluorescence emitted by the yellow YAG. The blue light from the GaInN active layer and the yellow light from the YAG seem to be white light to the human eyesight.

Some drawbacks, however, accompany the proposed GaInN-YAG LED. One drawback is extra existence of the YAG phosphor which is an entirely different material from the GaInN-LED. The extra YAG raises the material cost and the production cost. Another weak point is the low efficiency. Since the translucent YAG shields the LED chip, the YAG pond absorbs the most of the blue light from the LED. Little part of the blue light can go out of the YAG. The original blue GaInN LED has high luminosity of more than 1 Cd (candela) and high external quantum efficiency of more than 5%. The YAG GaInN LED which is produced by covering the blue LED with the YAG has poor luminosity of 0.5 Cd and low external quantum efficiency of 3.5%. This is the second weak point.

Besides the poor transparency, YAG is suffering from low efficiency of converting blue light to yellow light. The conversion efficiency is at most about 10%. The large thickness of the YAG increases the absorption of blue light in the YAG, which lowers both the luminosity and the efficiency. The low conversion is the third weak point.

White light sources have a great demand for lightenings, displays or liquid crystal display's backlights. Besides white color, there is still a large demand for neutral color light sources. For example, orange or yellow light sources which are neutral colors between red and green, have also a large demand for traffic signals and displays. Single LEDs which produce orange color and yellow color, i.e., neutral colors between red and green can be produced. However, the orange LEDs and the yellow LEDs are still suffering from low luminosity and high cost. For example, an LED having AlGaInP active layers on the nGaAs substrate emits yellow light. In order to compensate the poor expansion of injected electric current in the p-AlGaInP layer, the yellow LED should increase the thickness of the p-AlGaInP layer, which raises the production cost of MOCVD growth. Further, the AlGaInP yellow LED is plagued with low luminosity. Alternatively, a yellow light source is made by assembling a cheap red (AlGaAs) LED and a cheap green (GaP) LED. Some drawbacks accompany all the light sources for the red-green neutral colors. The assembly of two LEDs has drawbacks of the complicated device structure and the complicated power sources. Low luminosity, structural complexity and high cost are the common weak points of the prior neutral color light sources. Furthermore, none of the conventional LEDs can make red-blue neutral colors (e.g., pink, redpurple) and red-green-blue neutral color (e.g., various tones of white) by a single LED at all. One purpose of the present invention is to propose a novel LED which can produce red-blue neutral colors and red-green-blue neutral colors by a single LED. The neutral colors between red and blue (red-blue neutral colors) are simply written as RB-neutral colors from now onward. The neutral colors among red, green and blue (red-green-blue neutral colors) are similarly denoted as RGB-neutral colors from now.

FIG. 19 is a general chromaticity diagram. The chromaticity diagram is a graph showing the two-dimensional coordinates of an object visible light source color or an object visible body color by dividing and numerizing the stimuli of the object color into primary colors red(R), green(G) and blue(B) which correspond to three kinds RGB of color-sensing organs in a human eye. $Q(\lambda)$ denotes the spectrum of an object light source. The RGB stimuli on the color-sensing organ are obtained by multiplying the object spectrum $Q(\lambda)$ by the color matching functions for the primary colors RGB. Here, $r(\lambda)$ is the red color matching function, $g(\lambda)$ is the green color matching function and $b(\lambda)$ is the blue color matching function. The red stimulus X to the color-sensing organ is given by $X=\int Q(\lambda)r(\lambda)d\lambda$. The green stimulus Y to the sensing organ is $Y=\int Q(\lambda)g(\lambda)d\lambda$. The blue stimulus Z is $Z=\int Q(\lambda)b(\lambda)d\lambda$. The chromaticity diagram is a set (x,y) of a normalized red stimulus x and a normalized green stimulus y. The normalized red and green stimuli x and y are given by dividing the red stimulus X and the green stimulus Y by the sum (X+Y+Z) and obtaining $x=X/(X+Y+Z)$ and $y=Y/(X+Y+Z)$. The normalized $z=Z/(X+Y+Z)$ will be omitted from now for reducing the number of the chromatic parameters. The normalized blue stimulus z can be easily obtained from x and y, since $x+y+z=1$. The coordinate (x,y) is the set of the normalized red stimulus and the normalized green stimulus in the chromaticity diagram as shown in FIG. 17. The coordinate system can denote any color by a single point lying within the rectangle isosceles triangle with three corners (0,0),(1,0) and (0,1).

The boundary solid line of a horseshoe shape denotes monochromatic colors in FIG. 19. The horseshoe-shaped boundary curve is determined by the three color matching functions $r(\lambda)$, $g(\lambda)$ and $b(\lambda)$. For example, at a wavelength of longer than 550 nm, the sensitivity for blue is zero (z=0), and the chromaticity coordinate (x,y) of monochromatic colors lies on the line x+y=1. In the ranges of wavelengths shorter than 505 nm, with a decrease of the wavelength the blue component increases caused by a slow rise of the red component, which separates the monochromatic curve from the y-axis (x=0). Red end of the horseshoe-shaped monochromatic curve is the longest wavelength limit of 680 nm to 980 nm of the visible light. Blue end of the horseshoe-shaped curve is the shortest wavelength limit of 380 nm to 410 nm of the visible light. The shortest wavelength end and the longest wavelength end are connected by a straight line which does not correspond to monochromatic colors at all. The straight line is called a "purple boundary". Any point on the purple boundary is not a monochromatic color but inherently a neutral color including a plurality of primary colors. The inner region enclosed by the horseshoe curve and the purple boundary denotes neural colors. The innermost region is the white color region. As shown in FIG. 19, the white color region ranges from x=0.22 to x=0.43 and from y=0.21 to y=0.43. Conventional LEDs could not produce the white light within a single device. The lower region of the neutral colors of pink, purple, redpurple are not made yet by the prior LEDs. The upper region of the RG-neutral colors means orange and yellow which are made by the prior LEDs of poor efficiency of high cost. One purpose of the present invention is to provide a white color LED emitting white light. Another purpose of the present invention is to provide a neutral color LED emitting pink, redpurple, orange or so.

SUMMARY OF THE INVENTION

This invention proposes a white color or neutral color LED having an epitaxially grown active layer for producing light by the electron band gap transition and an impurity-doped substrate which plays the role of the phosphor by absorbing the light produced by the active layer and emitting fluorescent light. The epitaxial emission structure makes strong light of a shorter wavelength by the electron band gap transition. The impurity-doped substrate itself makes fluorescent light of a longer wavelength by absorbing a part of the emission produced in the active layer. Namely this invention makes the best use of both the active layer emission (band gap transition emission) and the impurity-doped substrate fluorescence.

An LED comprises a single crystal substrate and a epitaxial emission structure. In general, the substrate must have been transparent to the LED light of $\lambda 1$ which the epitaxial emission structure produces for avoiding the absorption by the substrate. If the substrate is opaque to the $\lambda 1$ light, efforts are made for eliminating the absorption of the substrate. When impurity-levels absorb the $\lambda 1$ light, attentions are paid to remove the impurities from the substrate. It is a conventional, traditional belief that the substrate should be as transparent and clean as possible in an LED.

The present invention positively gives the substrate fluorescence centers by doping impurities to the substrate to the contrary. The substrate obtains the character of photo-luminescence by the impurity doping. A set of the substrate fluorescence and the active emission $\lambda 1$ of LED produces new neutral colors and white color which prior LEDs cannot make.

The central wavelength of the fluorescence can be varied by changing the kind of the dopant, the dopant concentration and the defect density. The power of the fluorescence can be controlled by the thickness of the substrate. Arbitrary tones of white and arbitrary neutral colors can be obtained by the present invention by controlling the kind of the dopant, the dopant concentration, defect density and the substrate thickness.

The band gap transition emits the $\lambda 1$ light (central wavelength C). The fluorescence centers in the substrate absorb the $\lambda 1$ light and make $\lambda 2$ fluorescence (central wavelength B) which has a smaller energy than the $\lambda 1$ ($\lambda 1 < \lambda 2$). A sum of the $\lambda 1$ (wavelength center C)+the $\lambda 2$(wavelength center B) goes out from the LED, which seems white or another neutral color for human eyesight.

The wavelength $\lambda 1$ of the band gap transition emission can be changed by the kind of the active layer. The wavelength $\lambda 2$ of the fluorescence centers in the substrate can be controlled by the dopant concentration or the substrate thickness. Various white or neutral colors are made by controlling the dopant, the dopant concentration, the substrate thickness and the kind of the active layer. An ordinary LED never fails in having a substrate and an active layer. This invention is realized without adding neither new device nor new part to an ordinary LED. The only feature of the present invention is to dope pertinent dopants into the substrate.

FIG. 4 shows the emission spectrum of the LED of the present invention. Wavelength C is the active emission induced by the driving current. Wavelength B is the passive fluorescence emission excited by the active emission C. Correct concepts of wavelengths A, B and C are essential in order to understand this invention.

wavelength C=band gap transition emission at the active layer in the epitaxial structure.

wavelength B=substrate fluorescence.

wavelength A=the longest wavelength which is absorbed by the dopants for making the photo-luminescence.

Wavelength A is the lowest energy of the light which can be converted to the fluorescence having wavelength B. In the case of a single photon excitation, wavelength B is larger than wavelength A (B>A). When wavelength C is shorter than wavelength A (C<A), wavelength C made by the active layer can excite the photo-luminescence of B in the substrate. Then, the band gap emission C and the fluorescence B emanate out of the LED. (C+B) are the light produced by the LED. Wavelength A is only a critical value as the upper limit of being able to make the photo-luminescence.

FIG. 3(a) and FIG. 3(b) denote the LED device of the invention. An LED chip 9 is mounted upon an upper part 16 of a stem 10. The LED chip 9 consists of a substrate 12 and an epitaxial emission structure 13. In the case of having an electrode on the bottom of the substrate, another electrode is connected to a stem 11 by a wire 14. The chip 9, the stems 10 and 11 are molded by a transparent plastic package 15.

The substrate 12 is doped with the dopant which absorbs the light of a wavelength shorter than A and produces the fluorescence having a broad peak at B ($\lambda 2$). The wavelength C of the epitaxial emission structure 13 corresponds to $\lambda 1$. When C is shorter than A, the $\lambda 1$ can induce the photo-luminescence $\lambda 2$ in the substrate. Thus, allowable sets of a substrate and an active layer must satisfy the inequality C<A<B. Other conditions restrict pairing of a substrate and an active layer. The materials for the substrates are restricted by the condition of the probability of growing a large single crystal. The materials for active layers are restricted by the lattice-matching condition with the substrate.

It is a matter of course that the fluorescence energy is lower than the LED light energy ($\lambda 2 > \lambda 2$) in the case of a single photon excitation. In the case of multiple photon excitation, it is possible that the fluorescence has higher energy than the LED light.

In FIG. 4, the peak centered by wavelength C denotes the band gap emission from the epitaxial structure. Another broad peak having a top wavelength B signifies the fluorescence from the substrate. Wavelength C is determined by the material of the active layer. Wavelength C can be changed by varying the material of the active layer. Wavelength B can also be changed by varying the dopant of the substrate. The rate of the fluorescence is changed by both the dopant concentration and the thickness of the substrate.

This invention can produce wide range of neutral colors and various tones of white by changing the positive emission C and the passive fluorescence B. The LEDs of the invention are able to make the neutral colors between red and blue and white color which prior LEDs have never emitted. High controllability is one of the features of the present invention.

There is no difference in a chip structure between the prior LEDs and the present invention LEDs. This invention need not paint the stem over the chip with extra phosphor, e.g., YAG. Dispensing with the special-purposed stem with a cavity of FIG. 1, this invention uses ordinary stems. The LEDs of the present invention are made by applying the well-known low-cost LED manufacturing technology.

A substrate is indispensable for an LED as a base for supporting an epitaxial structure thereupon in any cases. A substrate is necessary for an LED. The substrate, however, has no active role except for supporting the epitaxial layers and leading a current in prior LEDs. When there were a probability of causing fluorescence by the substrate, intensive efforts had been made for eliminating the obstacle fluorescence by removing impurities and by purifying the substrate. It has been a common belief that the best substrate should be transparent, non-absorptive and non-fluorescent. This invention positively makes use of the fluorescence of the substrate. White color or neutral colors are produced by exploiting the substrate fluorescence in the LEDs of the invention. This invention is a novel technique contrived by toppling the common belief.

This invention proposes, for instance, a white color LED having a GaN substrate including fluorescent centers and a GaInN active layer (blue light emission structure). Another example of the invention is a neutral color LED having a AlGaAs substrate doped with Si and an epitaxially grown active layer of ZnSe, ZnSSe/ZnCdSe or ZnSeTe. A further example of the invention is a neutral color LED having a GaP substrate and a GaInN active layer. A fourth example is a neutral color LED having a ZnSe substrate and a ZnSe, ZnSe/ZnCdSe, or ZnSeTe active layer. The sets of the substrates and the active layers of the present invention are listed here in short.

(a) GaN substrate+GaInN active layer
(b) AlGaAs substrate+ZnSe, ZnSSe/ZnCdSe or ZnSeTe active layer
(c) GaP substrate+GaInN active layer
(d) ZnSe substrate+ZnSe, ZnSe/ZnCdSe, or ZnSeTe active layer Set(a) is a simple white color LED having a GaN substrate with fluorescent centers and a GaInN active layer for emitting blue light. The GaInN active layer produces blue light. The GaN substrate is not a film deposited on a sapphire crystal but an independent single crystal substrate. The dopants which should be doped into the GaN substrate are oxygen atoms, carbon atoms or nitrogen vacancies. The oxygen atoms, carbon atoms or nitrogen vacancies act as fluorescent centers in the GaN substrate. The fluorescent GaN substrate makes yellow light by absorbing blue light from the GaInN active layer. The blue light from the GaInN layer is mixed with the yellow fluorescence from the GaN substrate for producing white or another neutral light.

Set(b) requires an AlGaAs substrate and a ZnSe, ZnSSe/ZnCdSe or ZnSeTe active layer. However, a compound crystal AlGaAs cannot be grown by the conventional Bridgman or Czochralski method. The compound crystal AlGaAs substrate is made by some epitaxial methods on some wide inexpensive single crystal. For example, an AlGaAs substrate is produced by LPE method on a GaAs wafer. The LED has an extra bottom plate of GaAs. The dopant for making fluorescence is e.g., Si. The active layer is ZnSe, ZnSSe/ZnCdSe or ZnSeTe which produces blue light or green light by current injection. Si-doped AlGaAs absorbs blue or green light and emits yellow or orange fluorescence. The AlGaAs/ZnSe etc. LED of set (b) emits neutral light.

Set (c) is based upon a GaP substrate and a GaInN active layer. A GaP substrate crystal can be grown by the current Czochralski method. When GaP is doped with zinc atoms and oxygen atoms (Zn+O), the GaP obtains fluorescence property which makes fluorescent light at 700 nm by absorbing the light of a wavelength shorter than 550 nm. A GaInN active layer makes green light of a wavelength shorter than 550 nm. Thus GaP/GaInN LED emits neutral colors by mixing the fluorescent light and the green light. The (Zn+O)-doped GaP is semi-insulating. Semi-insulating substrates are also available to this invention. The property required for the substrate is only the fluorescence. Semi-insulating substrates and p-type substrates are available for the substrates of the present invention as well as the n-type substrates. In the case of set (c), the GaP substrate can be also an n-type GaP which is doped further with an n-impurity in addition to Zn and O.

Set (d) employs ZnSe substrates and ZnSe, ZnSe/ZnCdSe or ZnSeTe active layers. ZnSe, ZnSe/ZnCdSe or ZnSeTe active layers make blue light or green light by current injection. The dopant for the ZnSe substrate is (I+Al), (I+Cu) and (I+Ag). These dopants give the ZnSe substrate the fluorescence property. The fluorescence is orange or red. The LEDs of set(d) make neutral colors including blue and orange or red. And iodine converts ZnSe to ntype conductivity. Thus, the ZnSe substrate is an n-type substrate in set (d). ZnSe-type LEDs have already been manufactured and been sold on the market as blue light LEDs. Prior ZnSe LEDs are all blue light LEDs. The substrates have been either n-type GaAs substrates or semi-insulating ZnSe substrates in the prior ZnSe LEDs. A prior blue light LED has never adopted an n-type ZnSe substrate. This invention employs an n-type ZnSe substrate doped with iodine (I) and a metal (Al, Cu or Ag) to the contrary. Thus, set(d) has a clear novelty at the conductivity of the ZnSe substrate and the fluorescence of the ZnSe substrate against prior ZnSe blue LEDs.

The advantages of the present invention are now clarified here. Any prior single LED can produce neither RB-neutral colors nor RGB-neutral colors. The present invention, however, proposes the LED which can produce the RB-neutral colors or RGB-neutral colors by a single LED. The LED is high luminous single LED which emits red-purple light, pink light or white light. This invention further provides high luminous LEDs of RG-neutral colors,i.e., yellow and orange at low cost. The present invention is promising for displays, ornaments or lightenings, since the LEDs are light-weighted, inexpensive and low-voltage driven light sources of a long lifetime in comparison with current incandescent bulbs or fluorescent lamps.

Set(b) and set(c) adopt the well-known substrates of AlGaAs and GaP. However, set (a) (n-GaN substrate) and set (d) (n-ZnSe substrate) must employ unfamiliar and novel substrates. Thus, the preparation of the substrates should be explained for bringing this invention into practice with regard to set(a) and set(d).

Prior GaInN blue LEDs have been made upon an insulating sapphire substrate, since a GaN crystal can be epitaxially grown on the sapphire crystal. Besides, it has long been believed that a large GaN single bulk crystal with few defect cannot be grown. It is difficult to melt GaN even at high temperature under high pressure. Czochralski method and Bridgman method are inapplicable to make a GaN bulk single crystal due to the difficulty of preparing a GaN melt. The lack of a GaN large single crystal forces the manufacturers to adopt sapphire crystals as a substrate and to make the GaInN blue LED structure on the sapphire substrate. Thus, the blue GaInN LED can be built on the sapphire substrate. On the contrary, a GaN single crystal substrate is indispensable for this invention, because this invention makes use of the substrate as a phosphor. However, the vapor phase growth method can recently make a bulk single crystal of GaN. The development of the crystal growth technique makes this invention operative.

The vapor phase method makes a bulk GaN crystal by adopting a GaAs(111) single crystal as a substrate, covering the GaAs substrate with a mask having many dotted holes or stripe slits, growing thin buffer layers through the mask at a lower temperature, growing a thick GaN layer epitaxially on the GaN buffer layer at a higher temperature for a long time and eliminating the GaAs substrate. Namely, the vapor phase method makes a bulk GaN single crystal by diverting the epitaxial method for thin films. The vapor phase method is a diversion of film-making method. The vapor phase method has several versions which are different at the manner of supplying material gases. The versions are a HVPE (halide vapor phase epitaxy) method, an MOC (metallorganic chloride vapor phase) method and an MOCVD (metallorganic chemical vapor deposition) method. The HVPE method synthesizes a GaN bulk crystal by storing a masked GaAs substrate and a metal Ga melt in a hot-wall type furnace, blowing hydrogen gas ($H_2$) and HCl gas to the Ga melt in the furnace for making GaCl, transporting the GaCl gas to the GaAs substrate, supplying ammonia gas ($NH_3$) to the GaCl gas near the substrate for producing GaN molecules and depositing the GaN molecules upon the GaAs substrate through the holes of the mask. The MOC method grows a GaN bulk crystal by keeping a masked GaAs substrate in a hot-wall furnace, supplying metallorganic material e.g., TMG (trimethyl gallium), hydrogen gas and hydrochloric gas ($H_2$+HCl) for making GaCl, supplying $NH_3$ gas to the substrate for producing GaN molecules and piling the GaN molecules on the GaAs substrate through the openings of the mask. The MOCVD method produces a GaN bulk crystal by disposing a masked GaAs substrate in a cold-wall furnace, carrying a metallorganic material, e.g.,TMG by hydrogen gas ($H_2$), supplying ammonia gas ($NH_3$) to the GaAs substrate for synthesizing GaN molecules and depositing the GaN molecules on the GaAs substrate. These growing methods of bulk GaN crystals are all new and novel contrivances which have been disclosed by Japanese Patent Application No. 10-171276 (171276/'98) of the present applicant for the first time. Since a big GaN single crystal could not be made until recently, GaInN blue LEDs have been made not on GaN substrates but on sapphire substrates. The recent development of the technology enables to realize this invention by supplying a GaN single crystal substrate.

When a GaN bulk single crystal is grown by the vapor phase growth method, dopants, for example, oxygen or carbon or lattice defects (e.g.,nitrogen vacancy) can be introduced into the GaN crystal. The impurities of oxygen atoms and carbon atoms or the lattice defects act in the GaN crystal as fluorescence centers which absorb the exciting light of wavelengths shorter than 480 nm and emit fluorescent light of wavelengths dispersing between 520 nm and 650 nm. The central wavelength and the full width at half maximum (FWHM) of the fluorescence can be controlled by the sorts of dopants, dopant concentration or vacancy concentration. The fluorescence distributes widely from yellow to red (from 520 nm to 650 nm). The GaInN active layer makes blue LED light. The mixture ratio x of $Ga_{1-x}In_xN$ determines the wavelength of the LED light through the determination of the band gap. Human eyes see a sum of the LED light and the fluorescence as white light or neutral color light. Namely, white or neutral color is synthesized by an equation of white or neutral color=blue of GaInN+yellow of GaN.

Set (a) of the present invention includes two emission sources (1) and (2), (1) GaInN-type LED . . . blue light (400~510 nm) by electron band gap transition, and (2) GaN substrate . . . yellow-red light (520~650 nm) by fluorescence.

In this invention, the GaN substrate can be either n-type or p-type. In any cases, a pn-junction is formed in the epitaxially grown layers. The epitaxially-grown layers including the active layer are the LED emission structure of the shorter wavelength light. The wavelength of the LED emission is determined by the band gap of the active layer. The fluorescent material(phosphor) is the substrate itself.

Simplicity is one of the excellences of the LED of the present invention. In general, a substrate does accompany an LED, because an epitaxial structure including an active layer is built on the substrate in the LED. A substrate is not a newly-added part in the invention. The substrates of prior LEDs, however, play only passive roles of supporting the active layer physically and guiding the driving current. This invention positively exploits the substrate as a fluorescence source. What the present invention adds is to dope the substrate with some impurity which acts as a fluorescence center. In set(a), a white or neutral color LED is produced by adding dopant atoms or vacancies into the substrate of a blue GaInN LED.

"White" is a collective concept, because white is synthesized by primary colors red, blue and green. White includes various different tones. When the blue component is effective, the white becomes cold white. When the red and green component is dominant, the white tends to be warm white. When the GaN substrate is thick, the fluorescence yellow prevails against the LED blue due to an increase of the absorption of the blue by the thick substrate, which gives warm white. When the GaN substrate is thin, the LED blue surpasses the fluorescence yellow, which brings about cold white. The thickness of the GaN substrate regulates the intensity of the fluorescence. Namely, the ratio of the fluorescence can be varied by the thickness of the substrate. Some other conditions are imposed upon the scope of the thickness of the substrate. A thin substrate of a thickness of less than 50 μm invites breakdowns in the following wafer processes. The high probability of breakdowns lowers the yield and raises the cost. A thick substrate of a thickness more than 2 mm increases the size of the LED excessively, raises the ratio of fluorescence yellow beyond the limit, lowers the emission efficiency through an increment of absorption and enhances the material cost. Thus, the preferable scope of the substrate thickness is 50 μm to 2 mm (2000 μm).

Set(d) makes use of a novel substrate of n-type ZnSe. As mentioned before, prior blue ZnSe LEDs have been made mostly on n-GaAs substrates.

Czochralski method or Bridgman method cannot grow a ZnSe single crystal due to the large dissociation pressure of Se at a high temperature. Chemical Vapor Transport (CVT) method and grain-growth method are available for producing a ZnSe single crystal. The CVT method makes a ZnSe crystal by transporting Zn and Se by iodine (I) from a polycrystal ZnSe to a seed ZnSe single crystal, inducing a reaction for making ZnSe molecules and piling synthesized ZnSe molecules on the seed crystal. The CVT is sometimes called an iodine transport method. A polycrystal ZnSe is laid on the bottom of a growth chamber. A planar ZnSe seed crystal is fixed on the ceiling of the growth chamber. The growth chamber is filled with iodine (I) vapor. The bottom polycrystal ZnSe is heated at a higher temperature T1. The ceiling seed crystal ZnSe is heated at a lower temperature T2 (T2<T1). At the bottom, higher temperature T1 induces a reaction of $2ZnSe+2I_2 \rightarrow 2ZnI_2+Se_2$. Since both $ZnI_2$ and $Se_2$ are vapor, $ZnI_2$ vapor and $Se_2$ vapor rise in the chamber to the ceiling. At the ceiling, $ZnI_2$ and $Se_2$ are cooled by the seed ZnSe and are converted into ZnSe by a reverse reaction of $2ZnI_2+Se_2 \rightarrow 2ZnSe+2I_2$. The resultant ZnSe piles upon the seed ZnSe with the same orientation. Thus, a ZnSe single crystal grows upon the seed. $I_2$ vapor returns to the bottom for reacting with ZnSe again into $ZnI_2$.

The grain-growth method converts polycrystal ZnSe to a monocrystal ZnSe by starting a ZnSe polycrystal, heating a part of the polycrystal for facilitating the movement of grain walls in the polycrystal and inducing enlargement of a single dominant grain. Small grains move, rotate to the same orientation to the dominant grain and merge to the dominant grain together. Finally, all the grains are unified into a single large grain by the annealing. Dispensing with iodine (I) as a carrier of Zn, the grain-growth method can make a purer ZnSe single crystal immune from iodine. The techniques of preparing ZnSe substrate for set (d) have been explained.

BRIEF DESCRIPTION OF THE DRAWINGS

FIG. 18 is a table showing the substrate material, fluorescence wavelength, material of the active layer, injection current emission wavelength, symbols $\alpha$ to $\mu$, different points (substrate thickness, impurity concentration and components of the active layer).

DETAILED DESCRIPTION OF THE EMBODIMENTS

[Embodiment 1 ((I+Cu)ZnSe substrate, 630 nm; ZnSe/ZnCdSe active layer, 480 nm; pink, redpurple)]

Figure 5:
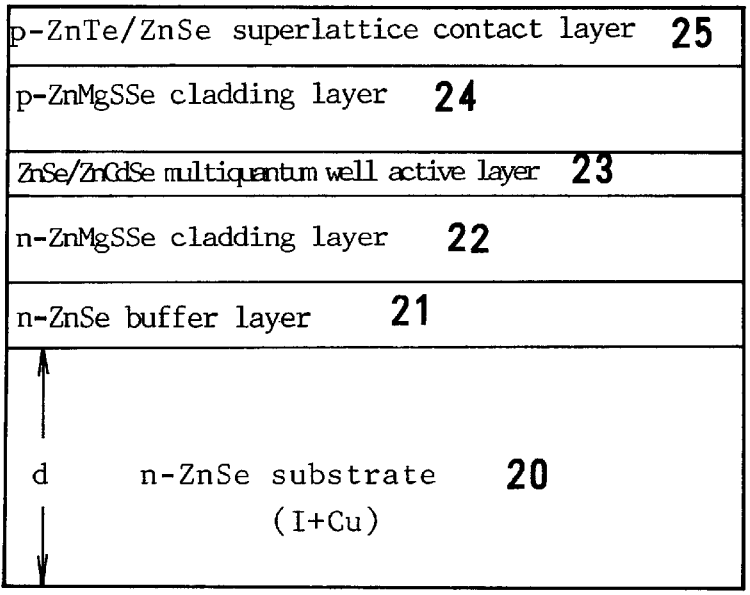
FIG. 5 is a schematic section showing stratum components of a neutral color or white color LED of embodiment 1 (ZnSe.ZnCdSe/ZnSe(I,Cu)) having an I+Cu doped ZnSe substrate and a ZnSe or ZnCdSe active layer.

A ZnSe substrate 20 doped with iodine (I) and copper (Cu) is prepared. An epitaxial emission structure having a ZnSe/ZnCdSe multiquantum well active layer 23 is built upon the ZnSe substrate as shown in FIG. 5.

The band tailing phenomenon allows the I+Cu doped ZnSe substrate 20 to absorb the light of a wavelength shorter than 510 nm (wavelength A=510 nm) and to produce the fluorescence (SA-emission) having a broad peak at 630 nm (wavelength B=630 nm) by the fluorescence centers (SA-centers) I and Cu. The band tailing phenomenon plays an important role in the present invention. A pure semiconductor of a band gap Eg is inherently transparent to the light of a wavelength $\lambda$ longer than the band gap wavelength $\lambda g$ (=hc/Eg) but opaque to the light of a wavelength $\lambda$ shorter than $\lambda g$. Doping some impurities produces impurity levels near the valence band or the conduction band within the forbidden band. The impurity levels enable electrons and holes to make a sub-band gap transition between the impurity levels and conduction band or between the impurity levels and the valence band. The substrate can absorb the light of a wavelength longer than $\lambda g$ due to the sub-band gap transition. Embodiment 1 allows the substrate to absorb the light of a wavelength till 510 nm (A) far longer than 460 nm (C=$\lambda g$).

A 50 $\mu$m thick ZnSe substrate ($\alpha$) and a 200 $\mu$m thick ZnSe substrate ($\beta$) are prepared for investigating the influence of the difference of the substrate thickness upon the colors. The epitaxial emission structures of FIG. 5 are epitaxially made upon the two kinds of the substrates of different thickness by an MBE method. The emission peak wavelength is 480 nm (C=480 nm).

The strata of the epitaxial wafer are, from bottom to top,
(1) n-ZnSe substrate (Cu+I dope, fluorescence B=630 nm) 20
(2) n-ZnSe buffer layer 21
(3) n-$Zn_{0.85}Mg_{0.15}S_{0.10}Se_{0.90}$ cladding layer 22
(4) ZnSe/$Zn_{0.88}Cd_{0.12}$Se multiquantum well active layer (active emission C=480 nm)
(5) p-$Zn_{0.85}Mg_{0.15}S_{0.10}Se_{0.90}$ cladding layer 24
(6) p-ZnTe/ZnSe superlattice contact layer 25
The epitaxial emission structure contains (2), (3), (4), (5) and (6). The p-impurity for the p-type layers 24 and 25 is nitrogen (N). The n-impurity for the n-type layers 22 and 21 is chlorine (Cl). The active layer (4) can be replaced by a $ZnSe_{0.99}Te_{0.01}$ active layer (C=480 nm).

A pattern of dotted p-electrodes of Pd/Au (palladium/gold) per a chip is made on the top p-ZnTe/ZnSe contact layer 25 of the epitaxial wafer. An Au thin p-electrode of a thickness less than 20 nm is deposited over the Pd/Au dot electrode. The thin Au film of a thickness less than 20 nm is transparent for blue light. An In n-electrode is formed on a bottom of the ZnSe substrate 20. The epitaxial wafer is cut into plenty of LED chips of a 250 $\mu$m×250 $\mu$m square. The LED chips are fitted on a stem and are molded with transparent plastic package.

The epitaxial emission structure produces 480 nm blue light. The I+Cu doped ZnSe substrate absorbs a part of the blue light by the band tailing phenomenon and emits fluorescence of 630 nm (wavelength B). The LED emits the synthesized light including 480 nm blue+630 nm red.

The output light of the LED is measured in a constant current mode. A typical luminosity is 2 mW at a 20 mA driving current.

Figure 6:
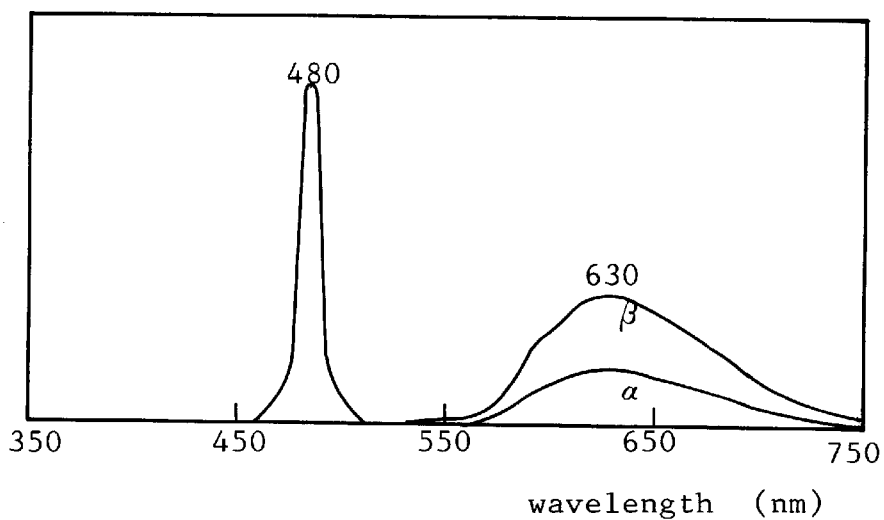
FIG. 6 is an emission spectrum of the neutral color or white color LED of embodiment 1 (ZnSe.ZnCdSe/ZnSe(I,Cu)). The abscissa is wavelength. The ordinate is emission intensity (in arbitrary unit).

FIG. 6 is an emission spectrum of embodiment 1. The spectrum has a sharp peak at 480 nm from the epitaxial structure and a broad peak at 630 nm from the ZnSe substrate.

Having the thinner substrate of 50 $\mu$m, LED($\alpha$) has weaker fluorescence. LED ($\alpha$) emits pink light. Having the thicker substrate of 200 $\mu$m, LED($\beta$) emits redpurple owing to stronger fluorescence. Including the more fluorescence centers, the thicker substrate has a stronger tendency to increasing fluorescence.

Figure 7:
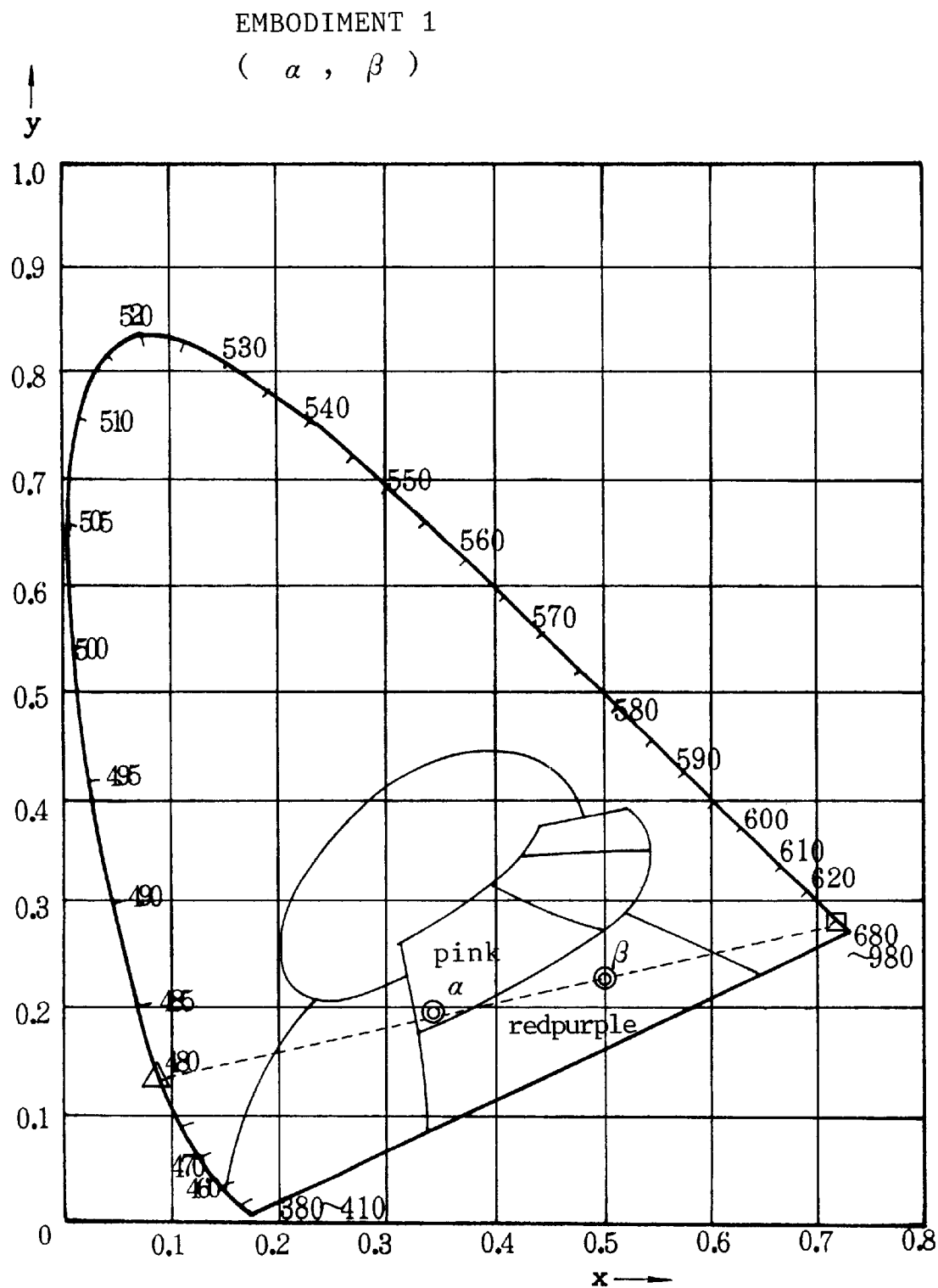
FIG. 7 is a chromaticity diagram demonstrating the chromaticity coordinates of the neutral color or white color LED of embodiment 1 (ZnSe.ZnCdSe/ZnSe(I,Cu)).

FIG. 7 is a chromaticity diagram of the LEDs of embodiment 1. LED($\alpha$) having the 50 $\mu$m thick substrate makes pink light of the chromatic coordinate (x,y)=(0.34, 0.21). LED($\alpha$) having the substrate of a 200 $\mu$m thickness produces redpurple light of the chromatic coordinate (x,y)=(0.50, 0.24). Point $\Delta$ is the chromaticity of the emission from the epitaxial emission structure. Point □ is the chromaticity of the fluorescence from the substrate. Chromaticity points 60 and $\beta$ align on a straight line connecting the two points.

A similar experiment is carried out on similar LEDs having an iodine (I) and silver (Ag) doped ZnSe substrate. The I+Ag ZnSe substrate LEDs reveal a similar result to the I+Cu doped substrate.

[Embodiment 2 ((Al+I)ZnSe substrate, 600 nm; ZnSe active layer, 465 nm; pink, redpurple)]

Figure 8:
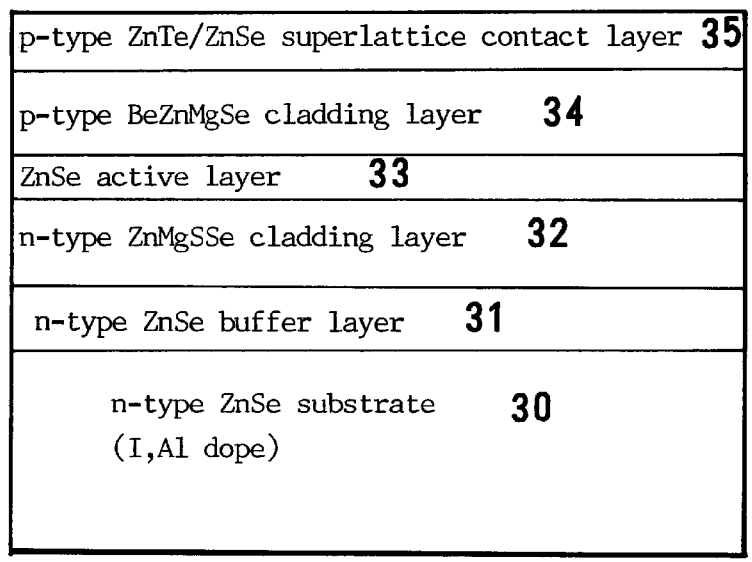
FIG. 8 is a schematic section showing stratum components of a neutral color or white color LED of embodiment 2 (ZnSe/ZnSe(Al,I)) having an Al+I doped ZnSe substrate and a ZnSe active layer.

A ZnSe substrate 30 doped with iodine (I) and aluminum (Al) is prepared. An epitaxial emission structure having a ZnSe active layer 33 is built upon the ZnSe substrate 30 as shown in FIG. 8.

The band tailing phenomenon allows the I+Al doped ZnSe substrate 30 to absorb the light of a wavelength shorter than 510 nm (wavelength A=510 nm) and to produce the fluorescence(SA-emission) having a broad peak at 600 nm (wavelength B=600 nm) by the self-activated (SA) centers I and Al. Embodiment 2 allows the substrate to absorb the light of a wavelength till 510 nm (A) far longer than 465 nm (C=$\lambda g$).

A less doped ZnSe substrate ($\gamma$) of $1\times10^{17}$ cm$^{-3}$ and a more doped ZnSe substrate ($\delta$) of $5\times10^{18}$ cm$^{-3}$ are prepared for investigating the influence of the difference of the dopant concentration upon the colors. Both substrates have the same thickness of 250 $\mu$m. The epitaxial emission structures of FIG. 8 are epitaxially made upon the two kinds of the substrates of different thickness by an MBE method. The emission peak wavelength is 465 nm (C=465 nm).

The strata of the epitaxial wafer are, from bottom to top,
(1) n-ZnSe substrate (Al+I dope, fluorescence B=600 nm) 30
(2) n-ZnSe buffer layer 31
(3) n-$Zn_{0.85}Mg_{0.15}S_{0.10}Se_{0.90}$ cladding layer 32
(4) ZnSe active layer (active emission C=465 nm) 33
(5) p-$Be_{0.20}Mg_{0.20}Zn_{0.60}$Se cladding layer 34
(6) p-ZnTe/ZnSe superlattice contact layer 35
The epitaxial emission structure contains (2), (3), (4), (5) and (6). The p-impurity for the p-type layers 34 and 35 is nitrogen (N). The n-impurity for the n-type layers 32 and 31 is chlorine (Cl).

LED devices are fabricated from the epitaxial wafer by a similar way to embodiment 1. The epitaxial emission structure produces 465 nm blue light (C). The I+Al doped ZnSe absorbs a part of the blue light by the band tailing phenomenon and emits fluorescence (B) of 600 nm. The LED emits the synthesized light including 465 nm blue+600 nm red.

The output light of the LED is measured in a constant current mode. A typical luminosity is 1 mW at a 20 mA driving current. The colors of the LEDs of embodiment 2 are redpurple and yellowish pink.

Figure 9:
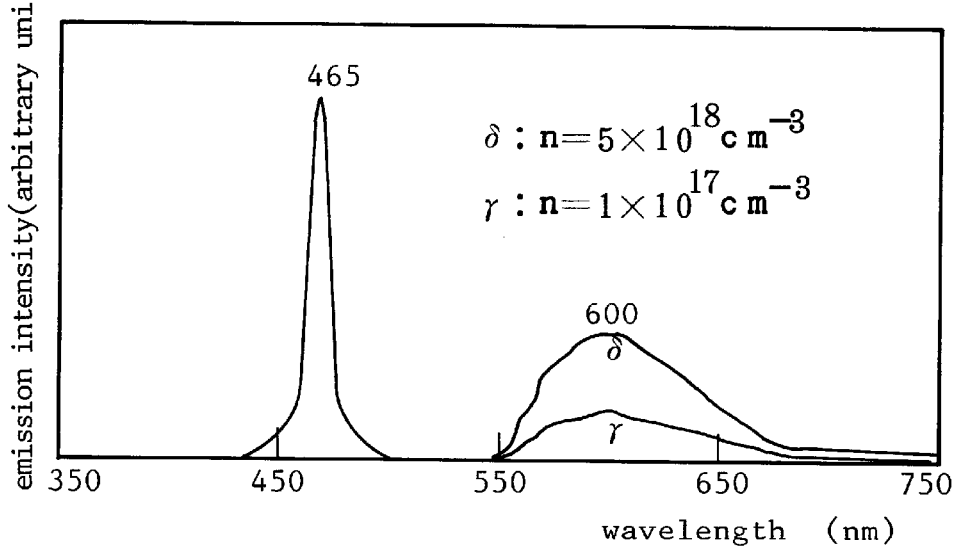
FIG. 9 is an emission spectrum of the neutral color or white color LED of embodiment 2 (ZnSe/ZnSe(Al,I). The abscissa is wavelength. The ordinate is emission intensity (in arbitrary unit).

FIG. 9 is an emission spectrum of embodiment 2. The spectrum has a sharp peak at 465 nm from the epitaxial structure and a broad peak at 600 nm from the ZnSe substrate.

Having the smaller dopant concentration of $1\times10^{17}$ cm$^{-3}$, LED($\gamma$) has weaker fluorescence. LED ($\gamma$) emits bluish redpurple light. Having the larger dopant concentration of $5\times10^{18}$ cm$^{-3}$, LED($\delta$) emits yellowish pink owing to stronger fluorescence. The higher dopant concentration substrate has a stronger tendency to increasing fluorescence.

Figure 10:
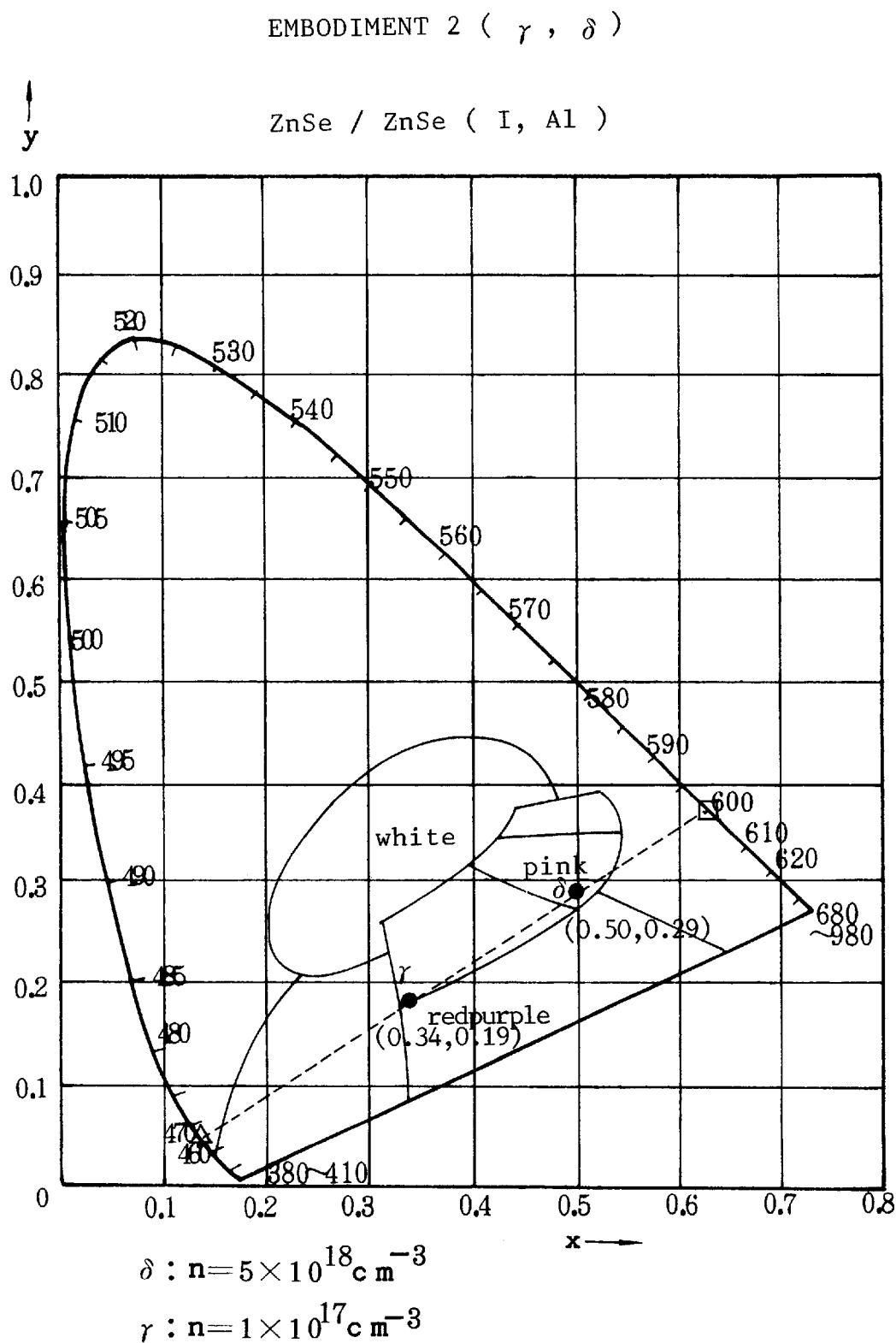
FIG. 10 is a chromaticity diagram demonstrating the chromaticity coordinates of the neutral color or white color LED of embodiment 2 (ZnSe/ZnSe(Al,I)).

FIG. 10 is a chromaticity diagram of the LEDs of embodiment 2. LED(γ) of the $1\times10^{17}$ cm$^{-3}$ concentration substrate makes bluish redpurple light of the chromatic coordinate (x,y)=(0.34, 0.19). LED(δ) of the $5\times10^{18}$ cm$^{-3}$ concentration substrate produces yellowish pink light of the chromatic coordinate (x,y)=(0.50, 0.29). Point Δ is the chromaticity of the emission of the epitaxial structure. Point □ is the chromaticity of the fluorescence of the substrate. Chromaticity points γ and δ align on a straight line connecting the two points.

[Embodiment 3 ((Si)AlGaAs substrate, 690 nm; ZnSSe/ZnCdSe, 520 nm & 550 nm; orange, yellow)]

A Si-doped n-AlGaAs layer 47 made on an Si-doped n-GaAs substrate 46 by a liquid phase epitaxy (LPE) is prepared as a substrate 40. An epitaxial emission structure having a ZnSSe/ZnCdSe active layer 43 is built upon the AlGaAs substrate 40 as shown in FIG. 11.

The band gap of the $Al_xGa_{1-x}As$ substrate can be changed within a scope from 570 nm to 860 nm by varying the Al ratio x. The substrate of embodiment 3 is an $Al_{0.50}Ga_{0.50}As$ (x=0.50) crystal doped with Si on the GaAs base 46. The Si doped AlGaAs substrate 40 allows to absorb the light of a wavelength shorter than 640 nm (wavelength A=640 nm) and to produce the photo-luminescence having a broad peak at 690 nm (wavelength B=690 nm) by the recombination center Si.

Figure 11:
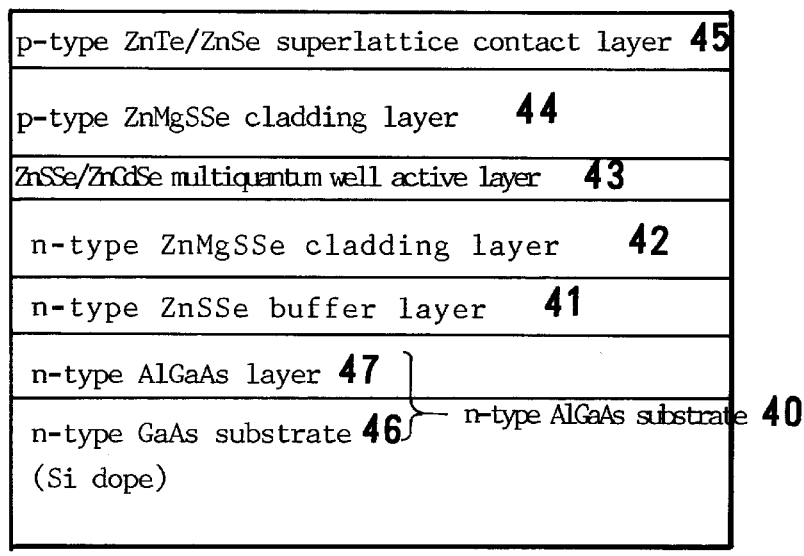
FIG. 11 is a schematic section showing stratum components of a neutral color or white color LED of embodiment 3 (ZnSSe.ZnCdSe/AlGaAs(Si)) having a Si doped AlGaAs substrate and a ZnSSe/ZnCdSe active layer.

The epitaxial emission structures of peak wavelengths (C) 520 nm (ε) and 550 nm (ζ) are fabricated upon the AlGaAs substrate 40 by an MBE method, as shown in FIG. 11.

The strata of the epitaxial wafer are, from bottom to top,
(1) n-GaAs substrate (Si dope) 46
(2) n-AlGaAs layer (Si dope, fluorescence B=690 nm) 47
(3) n-ZnSSe buffer layer 41
(4) n-$Zn_{0.90}Mg_{0.10}S_{0.15}Se_{0.85}$ cladding layer 42
(5) $ZnS_{0.06}Se_{0.94}/Zn_{0.70}Cd_{0.30}Se$ multiquantum well active layer (active emission C=520 nm) 43 (LED ε) or
(5') $ZnS_{0.06}Se_{0.94}/Zn_{0.60}Cd_{0.40}Se$ multiquantum well active layer (active emission C=550 nm)43 (LED ζ)
(6) p-$Zn_{0.90}Mg_{0.10}S_{0.15}Se_{0.85}$ cladding layer 44
(7) p-ZnTe/ZnSe superlattice contact layer 45

The epitaxial emission structure contains (2), (3), (4), (5) and (6). The p-impurity for the p-type layers 44 and 45 is nitrogen (N). The n-impurity for the n-type layers 42 and 41 is chlorine (Cl). The active layer (5) of LED E can be replaced by $ZnSe_{0.90}Te_{0.10}$ active layer (active emission C=520 nm).

LED (ε) and LED(ζ) are different in the mixture ratio x of Cd in $Zn_{1-x}Cd_xSe$ which is one of the films of the multiquantum well layer. LED(ε) is x=0.30 and LED (ζ) is x=0.40. A higher Cd ratio x prolongs the emission wavelength longer by changing the band gap of $Zn_{1-x}Cd_xSe$ narrower.

LED devices are fabricated from the epitaxial wafer by a similar way to embodiment 1. The p-electrode is Pd/Au like embodiment 1. But the n-electrode is an Au—Ge electrode on the bottom of the n-GaAs substrate.

The epitaxial emission structure produces 520 nm (ε) green light or 550 nm (ζ) yellowgreen light.

The Si doped AlGaAs substrate 47 can absorb a part of the green light of (ε) or the yellowgreen light (ζ) by the band tailing phenomenon and emit red fluorescence (B) of 690 nm. LED (ε) emits the light including 520 nm green+690 nm red. LED (ζ) emits the light including 550 nm yellowgreen and 690 nm red.

The output light of LEDs(ε) and (ζ) is measured in a constant current mode. A typical luminosity is 3 mW at a 20 mA driving current. The color of LED(ε) is yellow. The color of LED(ζ) is orange.

Figure 12:
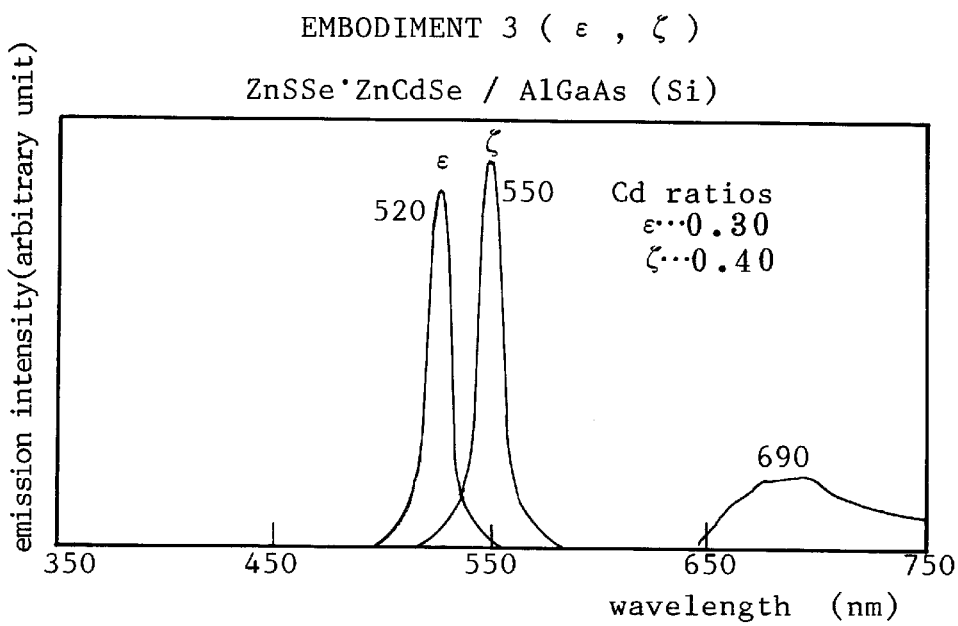
FIG. 12 is an emission spectrum of the neutral color or white color LED of embodiment 3 (ZnSSe.ZnCdSe/AlGaAs (Si)). The abscissa is wavelength. The ordinate is emission intensity (in arbitrary unit).

FIG. 12 is an emission spectrum of embodiment 3. The spectrum of LED(ε) has a sharp peak at 520 nm from the epitaxial structure and a broad peak at 690 nm from the AGAAs substrate. The spectrum of LED(ζ) has a sharp peak at 550 nm and a broad peak at 690 nm.

Figure 13:
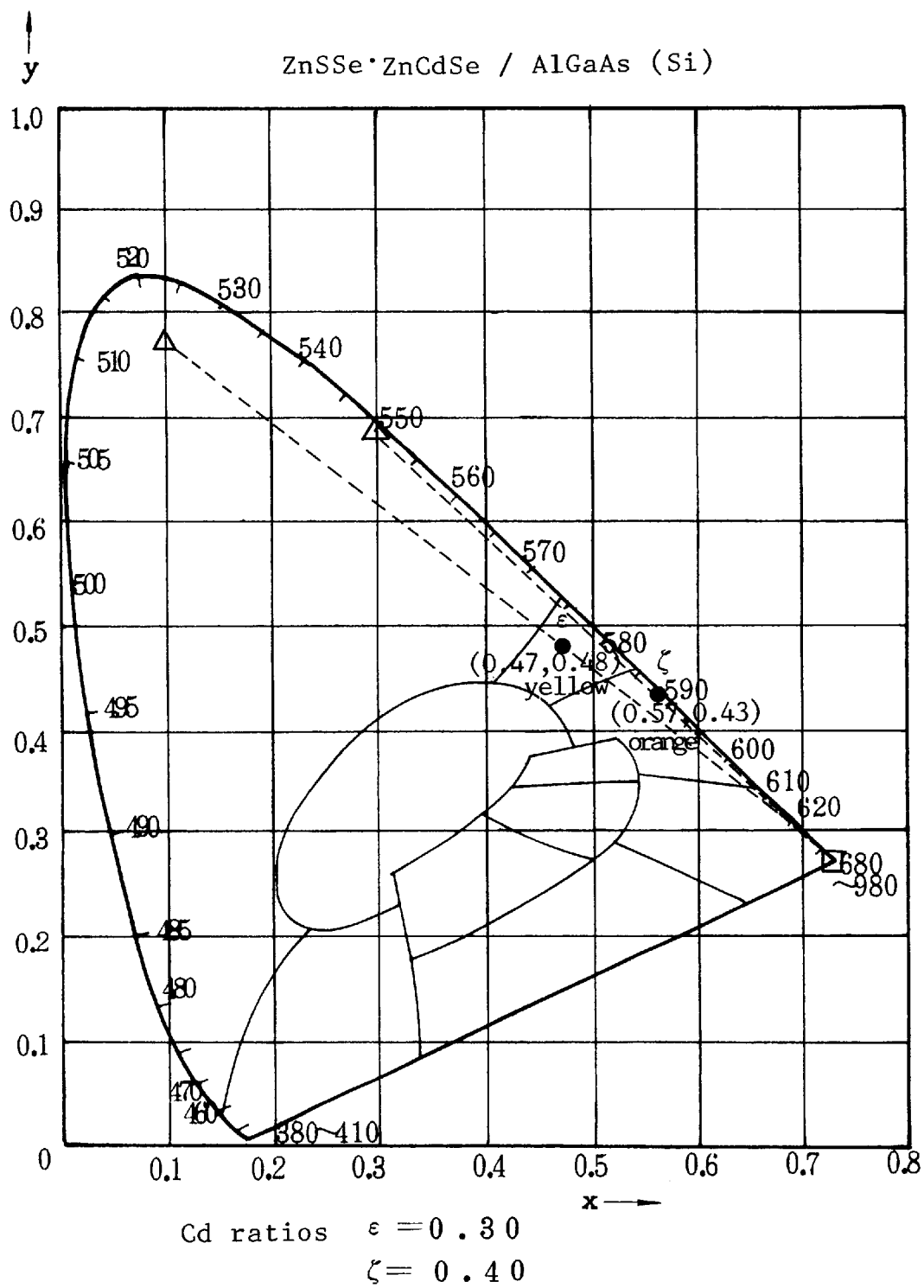
FIG. 13 is a chromaticity diagram demonstrating the chromaticity coordinates of the neutral color or white color LED of embodiment 3 (ZnSSe.ZnCdSe/AlGaAs(Si)).

FIG. 13 is a chromaticity diagram of the LEDs of embodiment 3. LED(ε) of a 520 nm peak wavelength makes yellow light of the chromatic coordinate (x,y)=(0.47, 0.48). LED(ζ) of the 550 nm peak wavelength produces orange light of the chromatic coordinate (x,y)=(0.57, 0.43). Points Δ are the chromatic points of the emission of the epitaxial structures of LEDs (ε) and (ζ). Point □ is the chromaticity of the fluorescence of the substrate. Chromaticity points ε and ζ align on a straight line connecting the two points.

[Embodiment 4 ((Zn,O)GaP substrate, 700 nm; GaInN active layer, 520 nm; yellow)]

Figures 14, 15:
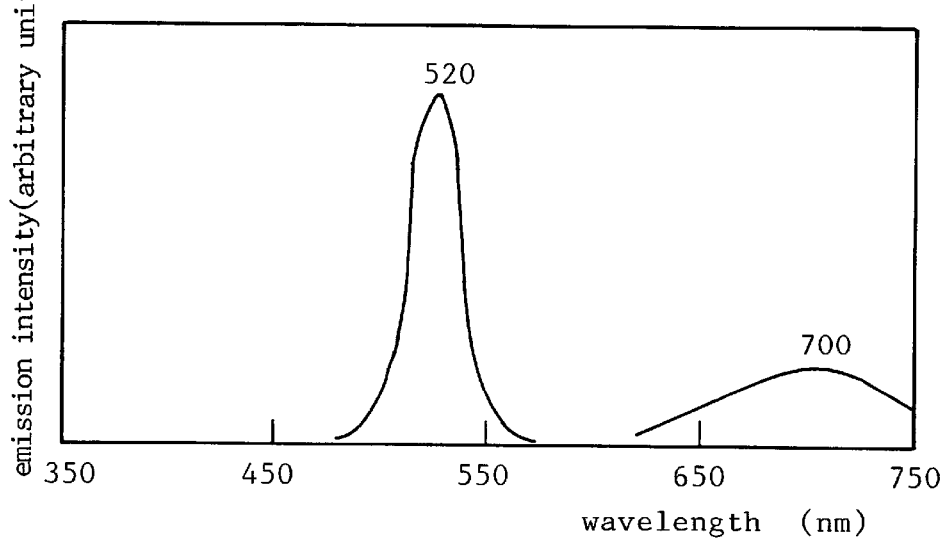
FIG. 14 is a schematic section showing stratum components of a neutral color or white color LED of embodiment 4 (GaInN/GaP(Zn, O)) having a Zn or O doped GaP substrate and a GaInN active layer.
FIG. 15 is an emission spectrum of the neutral color or white color LED of embodiment 4 (GaInN/GaP(Zn, O)). The abscissa is wavelength. The ordinate is emission intensity (in arbitrary unit).

A semi-insulating GaP wafer doped with Zn and O is prepared as a substrate 50. An epitaxial film structure has a GaInN active layer 53 as shown in FIG. 14. GaP is an indirect transition type semiconductor. GaP doped with Zn and O can absorb the light of a wavelength shorter than 550 nm (A=550 nm) and can make the fluorescence having a broad peak at 700 nm (B=700 nm).

The epitaxial structure shown in FIG. 14 is made on the semi-insulating GaP substrate 50 by an MOCVD method. The epitaxial film structure contains an active layer of emitting 520 nm green light (C=520 nm).

The strata of the epitaxial wafer are, from bottom to top,
(1) semi-insulating GaP substrate (Zn+O dope; fluorescence 700 nm) 50
(2) n-GaN contact layer (n-electrode) 51
(3) n-$Al_{0.15}Ga_{0.85}N$ cladding layer 52
(4) $Ga_{0.70}In_{0.30}N$ active layer (active emission 520 nm) 53
(5) p-$Al_{0.15}Ga_{0.85}N$ cladding layer 54
(6) p-GaN contact layer 55

Figure 1A:
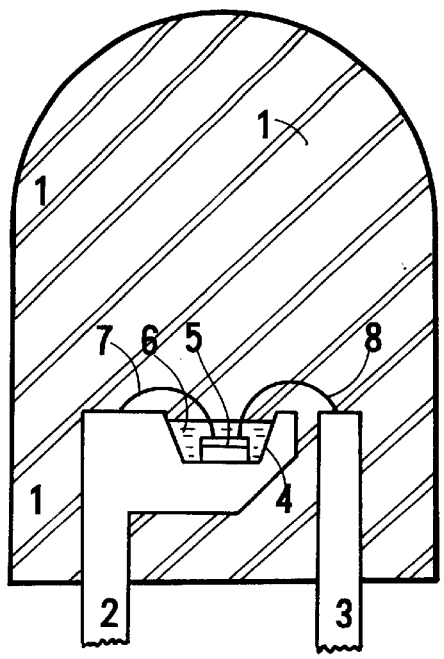
FIG. 1(a) is a vertical sectional view of a prior white color LED having a blue GaInN-LED chip and a yellow YAG phosphor burying the GaInN-LED chip.
Figure 1B:
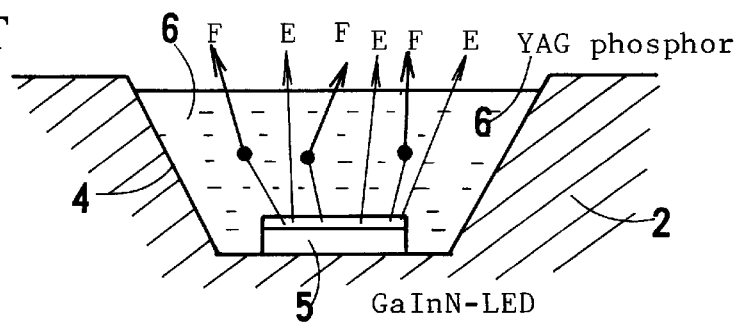
FIG. 1(b) is an enlarged vertically sectioned view of a part of the YAG-LED of FIG. 1(a) for clarifying the GaInN-LED emitting blue light and the YAG pond making yellow fluorescence.
Figure 2:
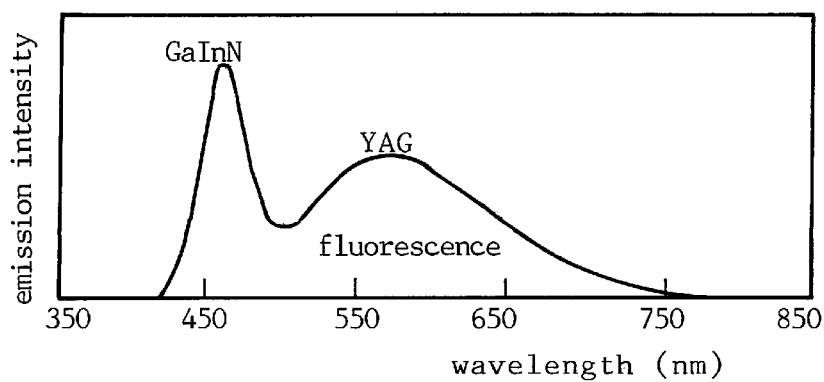
FIG. 2 is an emission spectrum of the white color LED of FIG. 1(a) and FIG. 1(b).

The epitaxial emission structure contains (2), (3), (4), (5) and (6). A dotted pattern of p-electrodes of Pd/Au is formed on the p-GaN contact layer 55 in a period of 500 μm×500 μm which is the size of a chip. Since the GaP substrate is insulating, an n-electrode cannot be formed on the bottom of the GaP substrate. Parts of the epitaxial structure are eliminated till the n-GaN contact layer 51. A pattern of dotted n-electrodes of Ti/Au is formed on the revealed n-GaN contact layer 51. After the formation of the p-electrodes and the n-electrodes, the epitaxial wafer is cut into a plenty of LED chips of a 500 μm×500 μm square. LED(η) is made by fitting the LED chip on a stem. The p-electrode and the n-electrode are connected to separated stems by two wires like the LED of FIG. 1(*a*).

The epitaxial emission structure of LED (η) produces 520 nm green light. The Zn and O doped GaP substrate can absorb a part of the green light and emit red fluorescence (B) of 700 nm. LED (η) emits the light including 520 nm green+700 nm red.

The output light of LEDs(η) is measured in a constant current mode. A typical luminosity is 3 mW at a 20 mA driving current. The color of LED(η) is yellow.

FIG. 15 is an emission spectrum of LED (η) of embodiment 4. The spectrum of LED(η) has a sharp peak at 520 nm from the epitaxial structure and a broad peak at 700 nm from the GaP substrate.

Figure 16:
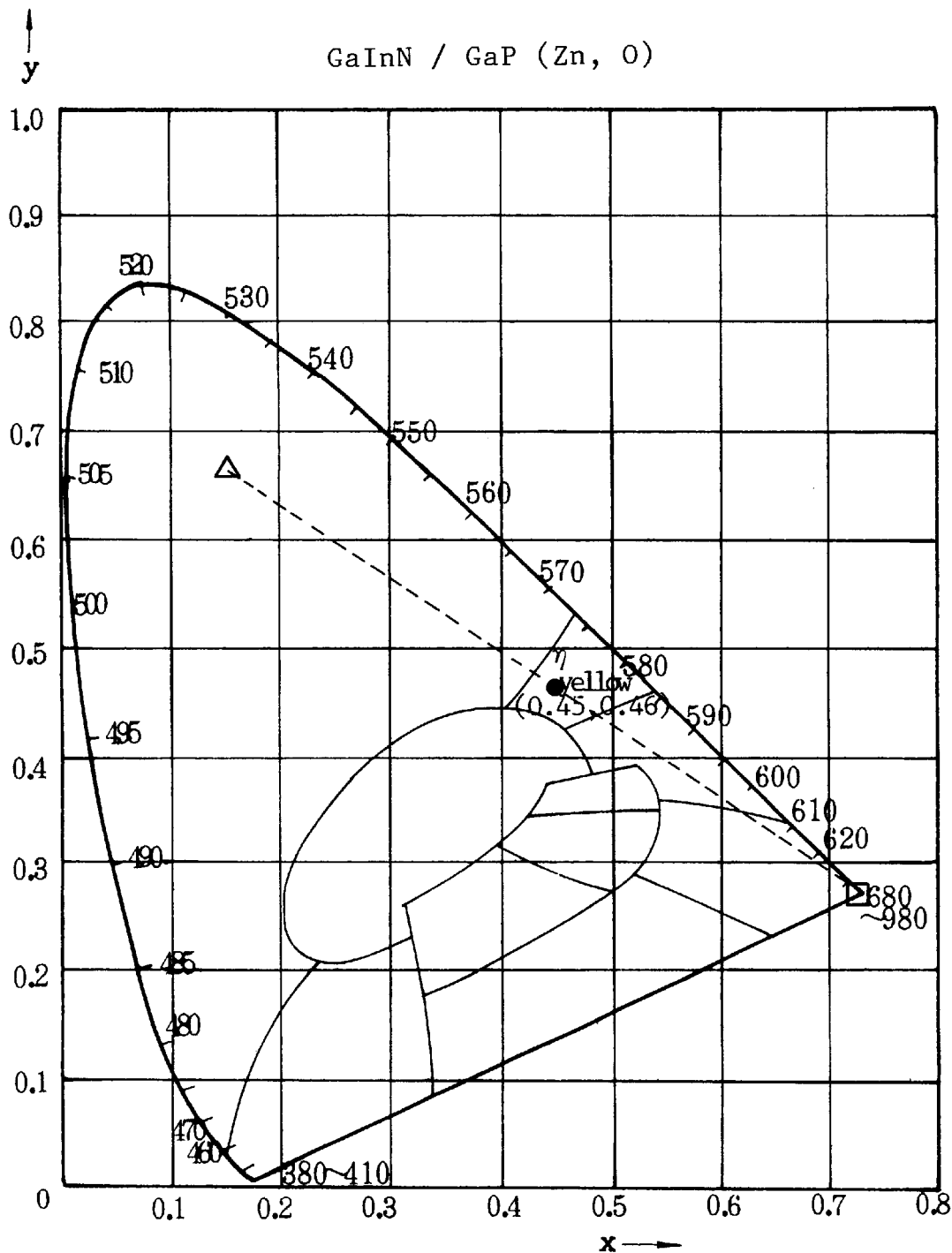
FIG. 16 is a chromaticity diagram demonstrating the chromaticity coordinates of the neutral color or white color LED of embodiment 4 (GaInN/GaP(Zn, O)).

FIG. 16 is a chromaticity diagram of the LED(η) of embodiment 4. LED(η) makes yellow light of the chromatic coordinate (x,y)=(0.45, 0.46). Point Δ is the chromatic point of the emission of the epitaxial emission structure of LED (η). Point □ is the chromaticity of the fluorescence of the substrate. Chromaticity η lies on a straight line connecting the two points.

[Embodiment 5 ((C.O.Va(N))GaN substrate, 550 nm; GaInN active layer 430 nm; epi-up; white)]

A GaN single crystal is made by either a vapor phase growing method (HVPE, MOC, MOCVD) or a melt-growing method as explained before. A GaN wafer made by the vapor phase growing method is prepared as a substrate 62. The GaN wafer is doped with oxygen (O), carbon (C) or nitrogen vacancy (Va(N)). O atoms, C atoms or N-vacancies act as the fluorescence centers in the GaN substrate. The dopants O, C or VaN give the n-type conductivity to the GaN substrate. The substrate thickness is preferably 50 $\mu$m to 2000 $\mu$m.

Figure 20:
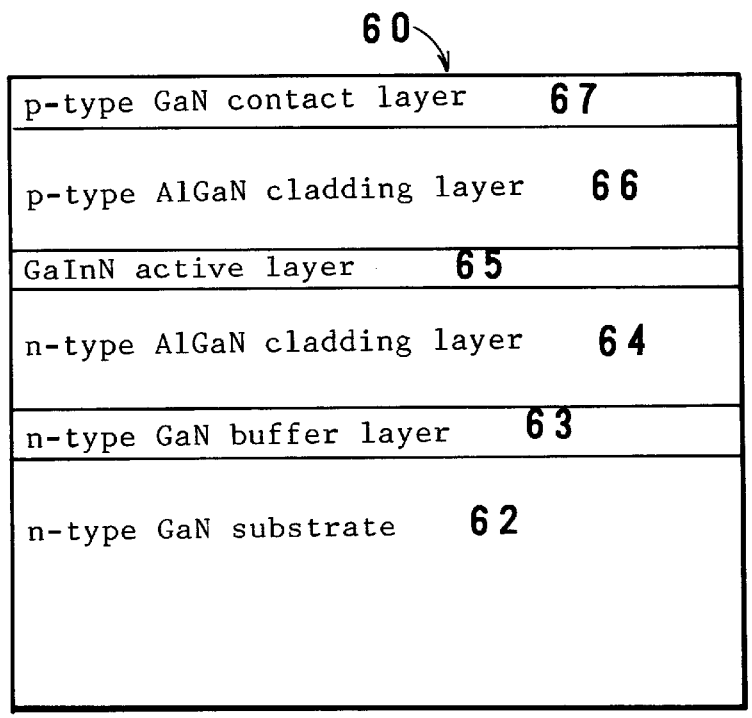
FIG. 20 is a schematic section showing stratum components of a white color LED of embodiment 5 (GaInN/GaN (C.O.Va(N))) having a C or O doped or N-vacant GaN substrate and a GaInN active layer.

An epitaxial emission structure shown in FIG. 20 is made on the n-type GaN substrate 62 by an MOCVD method. The epitaxial emission structure contains a GaInN active layer of emitting 430 nm bluepurple light (C=430 nm).

The strata of the epitaxial GaN wafer are, from bottom to top,
(1) n-GaN substrate (C.O.Va(N) dope; fluorescence 550 nm) 62
(2) n-GaN buffer layer 63
(3) n-$Al_{0.20}Ga_{0.80}N$ cladding layer 64
(4) $Ga_{0.88}In_{0.12}N$ active layer (active emission 430 nm) 65
(5) p-$Al_{0.20}Ga_{0.80}N$ cladding layer 66
(6) p-GaN contact layer 67

The epitaxial emission structure contains (2), (3), (4), (5) and (6). The p-dopant is Mg in (5) and (6). The n-dopant is Si in (1), (2) and (3). The p-GaN contact layer 67 having a high p-dopant concentration should be in ohmic contact with the p-electrode with a small contact resistance. Having a wider band gap than the active layer, the AlGaN cladding layers 64 and 66 confine the carriers within the active layer 65. The GaInN active layer 65 consists of thin InN films and GaN films piled by turns.

Figure 3A:
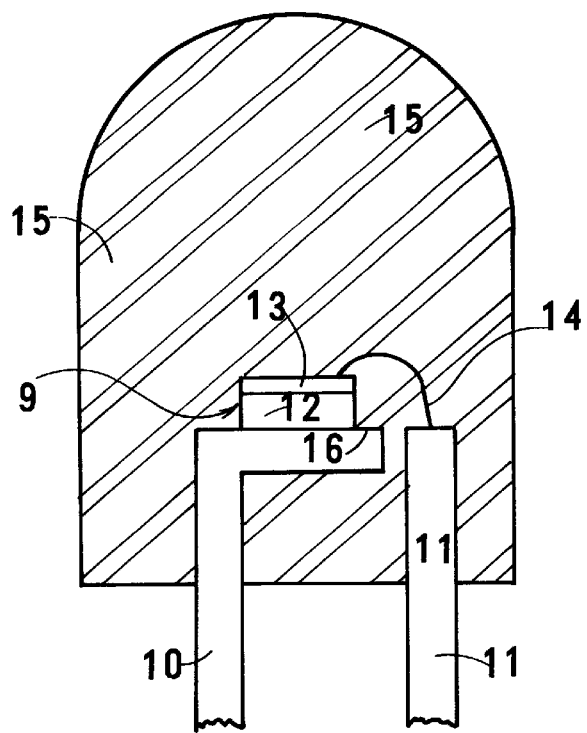
FIG. 3(a) is a vertically-sectioned view of a white color LED or a neutral color LED of the present invention.
Figure 3B:
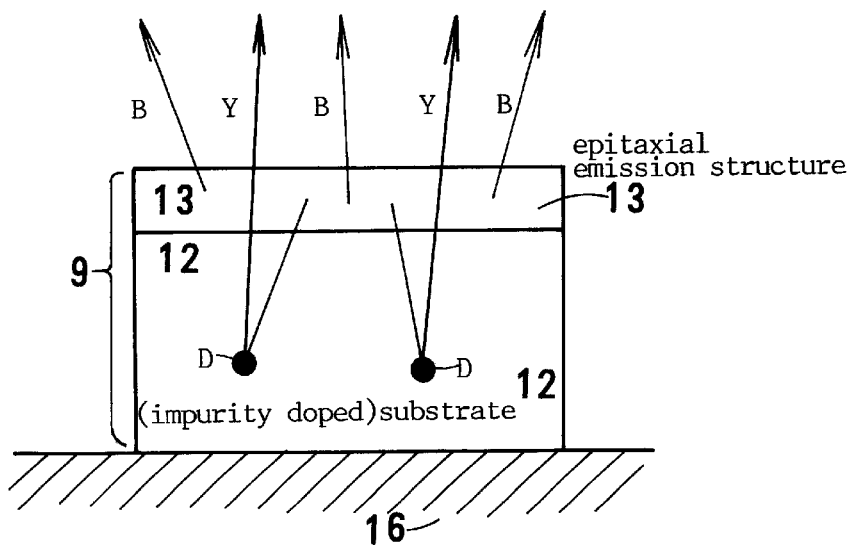
FIG. 3(b) is an enlarged vertically sectional view of a part of the white color or neutral color LED of FIG. 3(a) for explaining the blue light emission from the epitaxial emission structure and the yellow light from the SA-centers in the substrate.
Figure 4:
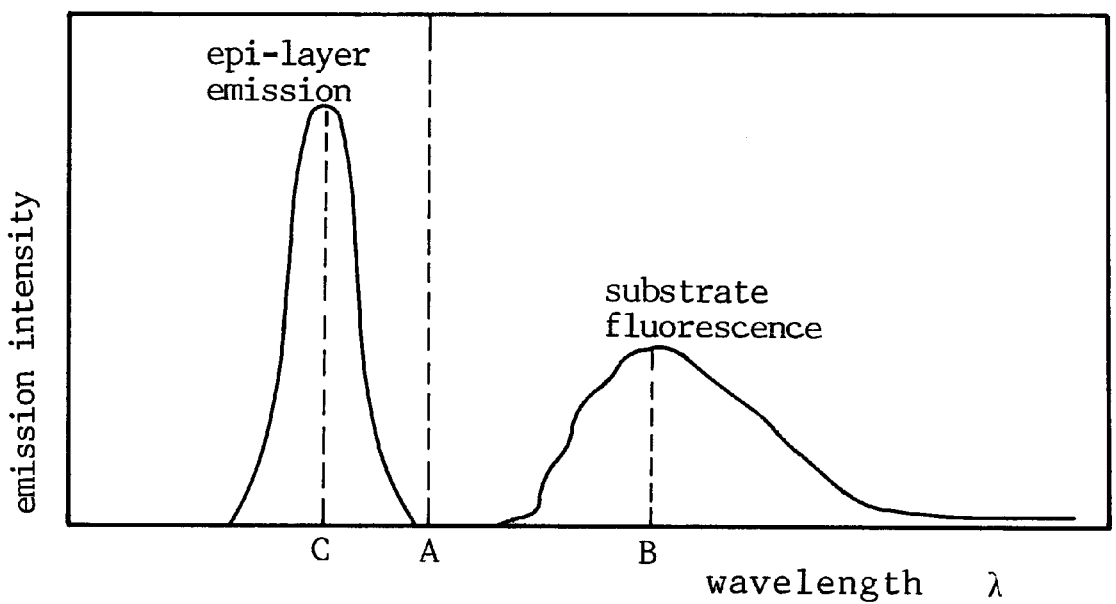
FIG. 4 is an explanatory emission spectrum of the white or neutral color LED of the present invention which makes the best use of the positive current injection emission and the passive substrate fluorescence. Wavelength A is the longest limit of wavelengths which can induce the fluorescence. Wavelength B is the peak wavelength of the substrate fluorescence. Wavelength C is the peak wavelength of the band gap transition emission by current injection.

A dotted pattern of p-electrodes of Pd/Au is formed on the p-GaN contact layer 67 in a period of 300 $\mu$m×300 $\mu$m which is the size of a chip. An n-electrode of indium (In) is formed overall on the bottom surface of the n-GaN substrate 62. The In n-electrode can be replaced by another n-electrode of In/TiAu. After the formation of the electrodes, the epitaxial GaN wafer is cut into a plenty of LED chips of a 300 $\mu$m×300 $\mu$m square. An LED device is made by fitting the LED chip with the n-electrode facing downward on a stem and with the p-electrode upward. The p-electrode is connected to another stem like the LED of FIG. 3($a$). The LED chip and the stems are molded within a transparent plastic package.

Figure 21:
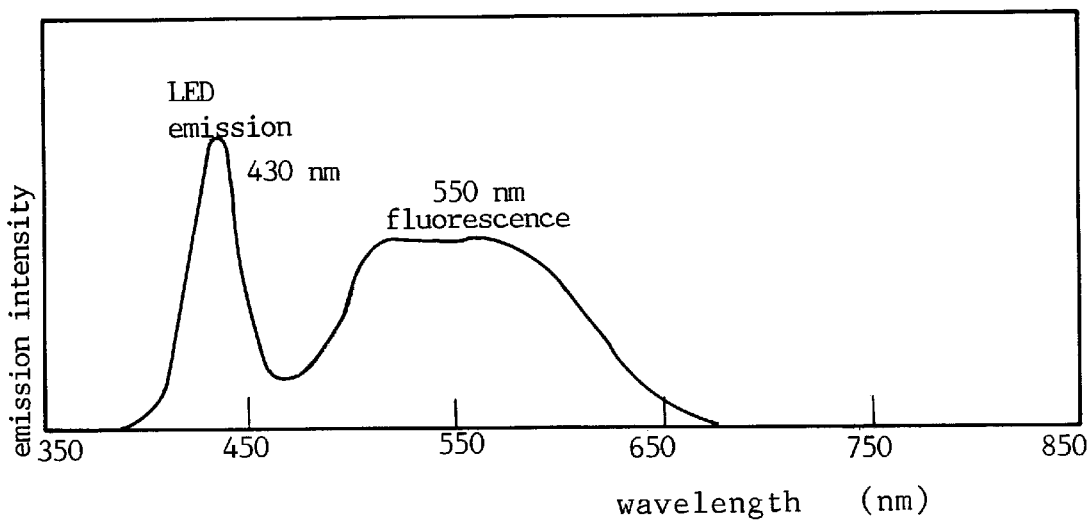
FIG. 21 is an emission spectrum of the neutral color or white color LED of embodiment 5 (GaInN/GaN(C.O.Va (N))). The abscissa is wavelength. The ordinate is emission intensity (in arbitrary unit).

The output light of the LED is measured in a constant current mode. A typical luminosity is 1.5 Cd at a 20 mA driving current. FIG. 21 is an emission spectrum of the LED of embodiment 5. The spectrum of the LED has a sharp peak at 430 nm from the epitaxial structure and a broad peak at 550 nm from the GaN substrate. The color of the LED is bluish white.

[Embodiment 6 ((C.O.Va(N))GaN substrate, 580 nm; GaInN active layer, 460 nm; epidown; white)]

Three kinds of GaN wafers of different thicknesses made by the melt-growing method are prepared as a substrate for investigating the influence of the substrate thickness on the light. The GaN wafer is doped with oxygen (O), carbon (C) or nitrogen vacancy (Va(N)). The thicknesses are 100 $\mu$m($\kappa$), 500 ($\lambda$) and 1 mm($\mu$).

An epitaxial emission structure shown in FIG. 20 is made on the n-type GaN substrate by an MOCVD method like embodiment 5. The epitaxial emission structure contains a GaInN active layer doped with Zn of emitting 460 nm bluepurple light (C=460 nm).

The strata of the epitaxial GaN wafer are, from bottom to top,
(1) n-GaN substrate (C.O.Va(N) dope; fluorescence 580 nm) 62
(2) n-GaN buffer layer 63
(3) n-$Al_{0.20}Ga_{0.80}N$ cladding layer 64
(4) Zn doped $Ga_{0.88}In_{0.12}N$ active layer(active emission 460 nm) 65
(5) p-$Al_{0.20}Ga_{0.80}N$ cladding layer 66
(6) p-GaN contact layer 67

The epitaxial emission structure contains (2), (3), (4), (5) and (6). The p-dopant is Mg in (5) and (6). The n-dopant is Si in (1), (2) and (3).

An overall pattern of p-electrodes of Pd/Au is formed on the whole of the p-GaN contact layer 67 with a covering rate of 100%. An n-electrode pattern of indium (In) of a 100 $\mu$m×100$\mu$ square per a chip is formed on the bottom surface of the n-GaN substrate in a period of 300 $\mu$m×300 $\mu$m with a covering rate of 11%. After the formation of the electrodes, the epitaxial GaN wafer is cut into a plenty of LED chips of a 300 $\mu$m×300 $\mu$m square. An LED device is made by fitting the LED chip upside down on a stem with the n-electrode facing upward and with the p-electrode facing downward and being contact with the stem. The n-electrode is connected to another stem. This type is called briefly "epi-side down". The LED chip and the stems are molded within a transparent plastic package.

The output light of the LED is measured in a constant current mode. A typical luminosity is 1.5 Cd to 2 Cd at a 20 mA driving current. Embodiment 5 is suffering from fluctuation of colors in the direction of eyesight. Embodiment 6 is immune from the directional fluctuation of colors, since the chip is mounted upside down on the stem. The color of the light emitted from the LEDs is white. But tones of white are different for three kinds of LEDs $\kappa$, $\lambda$ and $\mu$.

Figure 22:
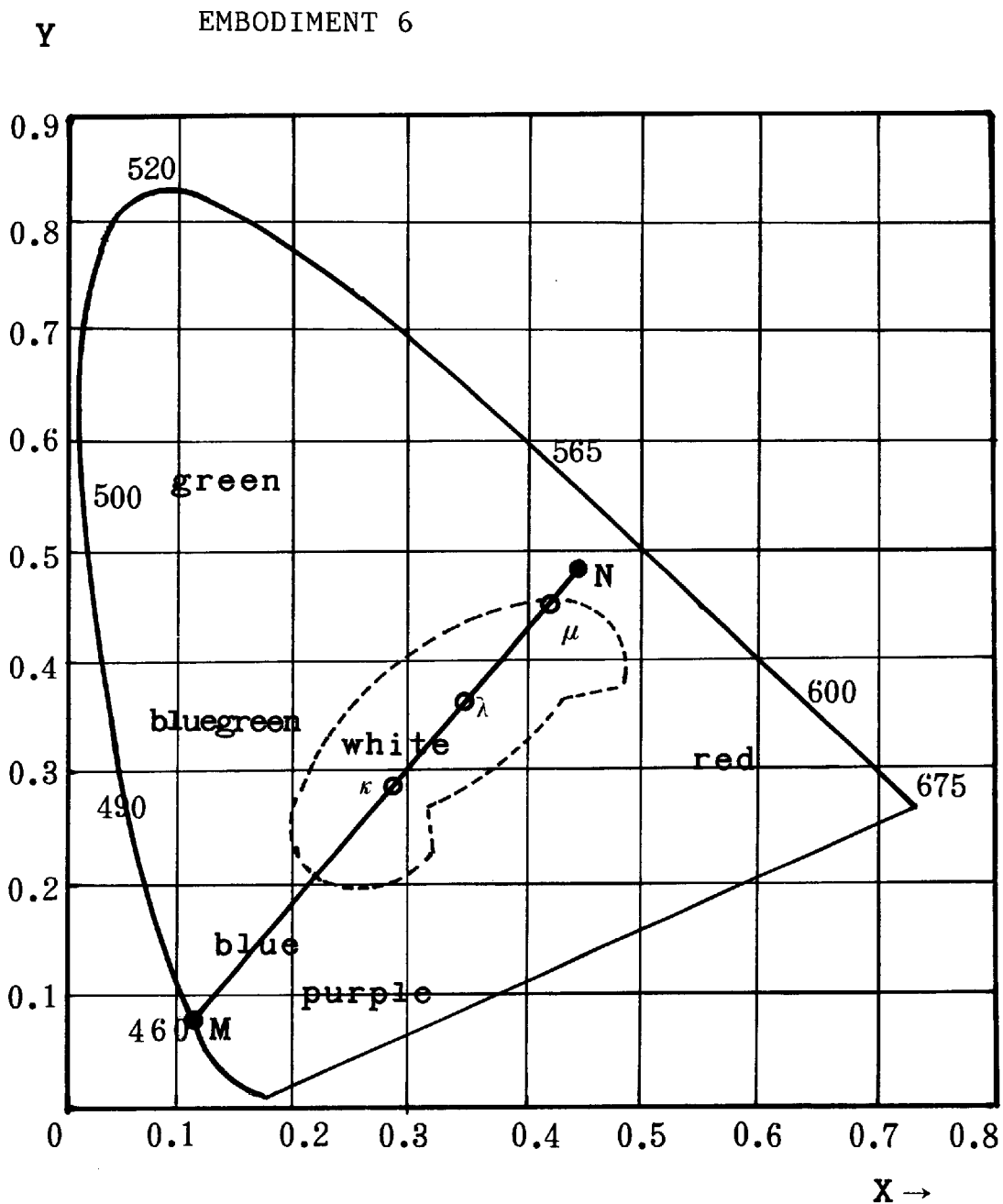
FIG. 22 is a chromaticity diagram demonstrating the chromaticity coordinates $\kappa$, $\lambda$, $\mu$, of the white color LEDs with the substrates of different thicknesses of embodiment 6 (GaInN/GaN(C.O.Va(N))).

($\kappa$) 100 $\mu$m thick LED . . . cold bluish white
($\lambda$) 500 $\mu$m thick LED . . . pure white
($\mu$) 1000 $\mu$m thick LED . . . warm yellowish white
FIG. 22 denotes the chromaticities of LEDs $\kappa$, $\lambda$ $\mu$.

In FIG. 22, point M is the chromaticity of the active layer emission having a peak at 460 nm. Point N is the chromaticity of the fluorescence (580 nm) from the substrate. Any synthesized light from the active layer emission and the substrate fluorescence lies on the line MN. The thinner substrate moves the chromaticity toward M by weakening the fluorescence.

The thicker substrate moves the chromaticity toward N by enhancing the fluorescence.

point $\kappa$ for a 100 $\mu$m thickness=(0.29, 0.29)
point $\lambda$ for a 500 $\mu$m thickness=(0.35, 0.36)
point $\mu$ for a 1000 $\mu$m thickness=(0.42, 0.45)

The tones of white can be expressed by color temperature.

point $\kappa$ . . . 8000K bluish white
point $\lambda$ . . . 5000K middle white
point $\mu$ . . . 3000K yellowish white Alternatively, it is confirmed that the tone of white is also changed by the dopant concentration. The wavelength C of the epitaxial structure can be varied from 400 nm to 500 nm by changing the ratio x of the $Ga_{1-x}In_xN$ active layer. For any wavelength C between 430 nm and 500 nm, white color LEDs are obtained by optimizing the thickness of the substrate.

Figure 17:
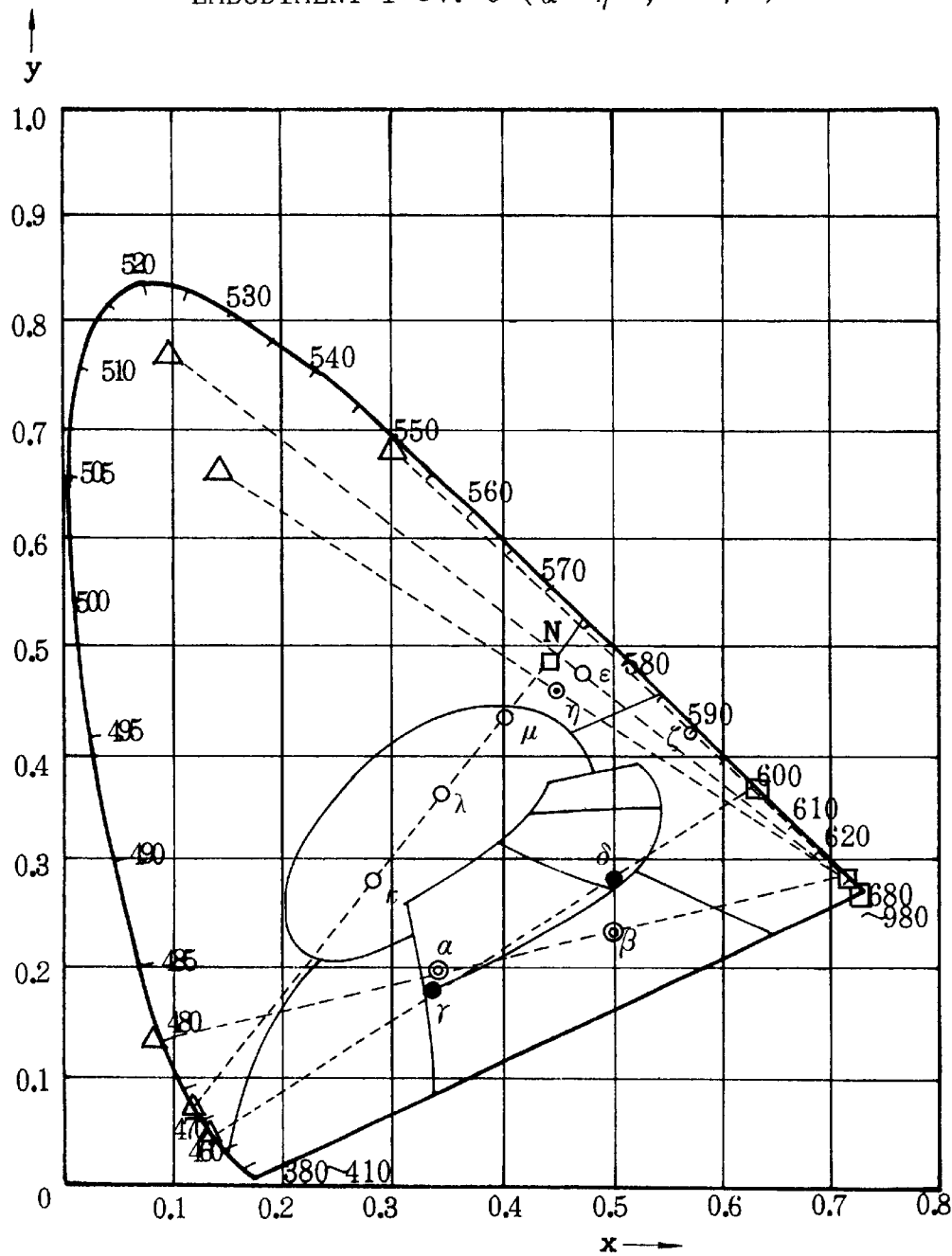
FIG. 17 is a chromaticity diagram showing the chromaticity coordinates of embodiments 1,2,3,4 and 6 including symbols ($\alpha$-$\eta$, $\kappa$-$\mu$) as a whole.
Figure 19:
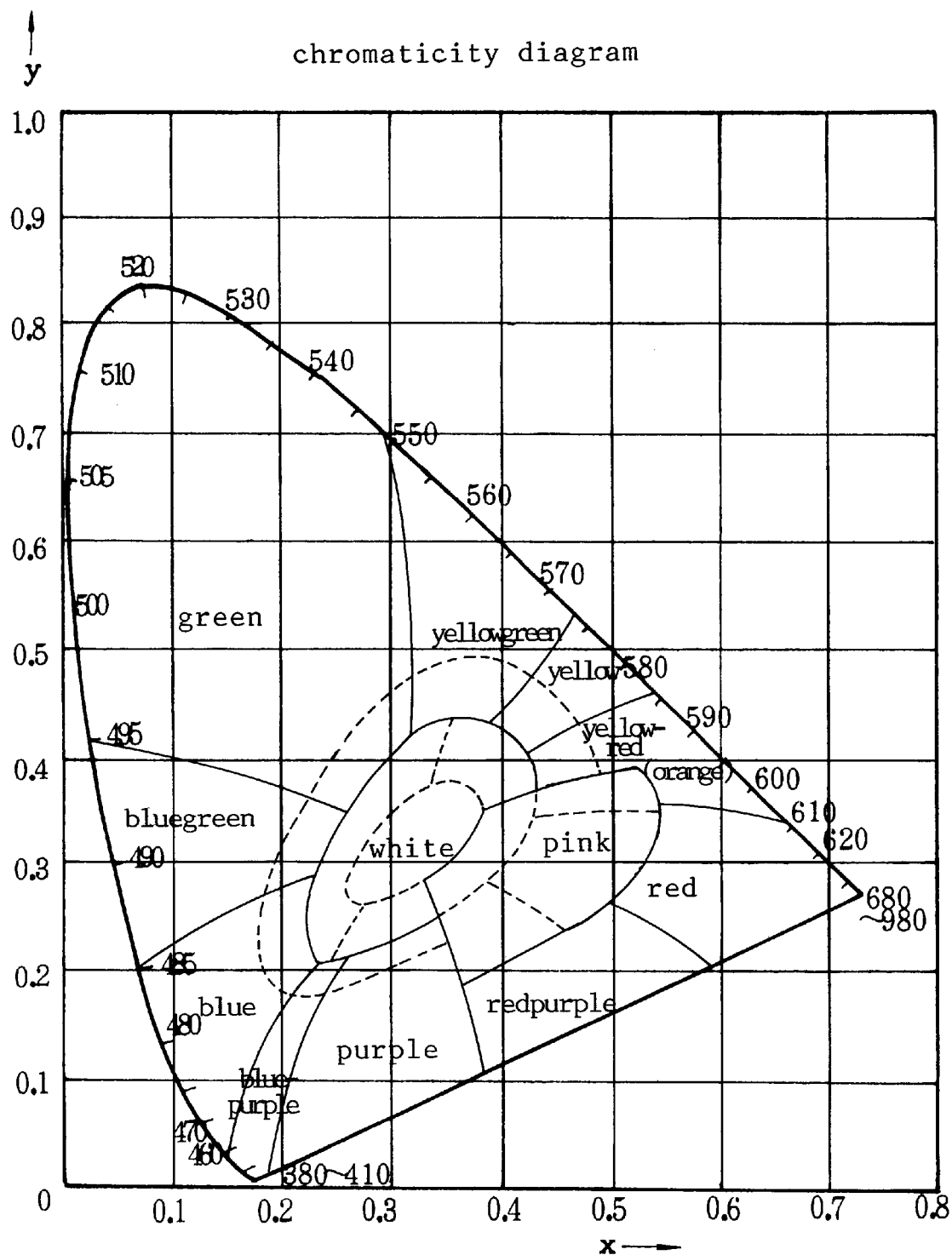
FIG. 19 is a general chromaticity diagram having red component by the x coordinate and green component by the y coordinate for showing monochromatic colors lying on the horseshoe-shaped solid curve and neutral color regions lying inner within the horseshoe curve.

FIG. 17 shows the LED chromaticities, the active layer chromaticities and the substrate chromaticities of LEDs $\alpha$-$\eta$ and $\eta\mu$ of embodiments 1,2,3,4 and 6.

FIG. 18 is a table showing the substrate materials, the fluorescence wavelength, the materials of epitaxial emission structures, the current injection light wavelength, the different points and the symbols of embodiments 1 to 6.

We claim:

1. A substrate-fluorescent LED comprising:
   a semiconductor or insulator substrate doped with dopants absorbing light and producing fluorescence as fluorescence centers; and
   an epitaxial emission structure including an active layer emitting light by electron band gap transition induced by current injection;
   wherein white color or neutral colors of purple, redpurple, pink, yellow or orange are synthesized by mixing the light from the active layer with the fluorescence from the substrate.

2. An LED as claimed in claim 1, wherein a peak wavelength of the fluorescence is changed by varying a material of the substrate.

3. An LED as claimed in claim 1, wherein a peak wavelength of the fluorescence is changed by varying a kind of the dopant in the substrate.

4. An LED as claimed in claim 1, wherein intensity of the fluorescence is changed by varying a thickness of the substrate.

5. An LED as claimed in claim 4, wherein the thickness of the substrate is 50 μm to 2 mm.

6. An LED as claimed in claim 1, wherein intensity of the fluorescence is changed by varying a concentration of the dopant.

7. An LED as claimed in claim 1, wherein a peak wavelength of the light from the active layer is changed by varying a king of the active layer.

8. An LED as claimed in claim 1, wherein the substrate is an n-type AlGaAs substrate and the active layer is a ZnSe layer, a ZnSSe/ZnCdSe layer or a ZnSeTe layer.

9. An LED as claimed in claim 8, wherein the AlGaAs substrate is formed upon an n-type GaAs single crystal.

10. An LED as claimed in claim 8, wherein the dopant doped into the AlGaAs substrate is Si.

11. An LED as claimed in claim 1, wherein the substrate is a GaP substrate and the active layer is a GaInN layer.

12. An LED as claimed in claim 11, wherein the dopant doped into the GaP substrate is Zn and O.

13. An LED as claimed in claim 1, wherein the substrate is an n-type ZnSe substrate doped with at least two dopants and the active layer is a ZnSe layer, a ZnSe/ZnCdSe layer or a ZnSeTe layer.

14. An LED as claimed in claim 13, wherein the dopants doped into the substrate are Al and I.

15. An LED as claimed in claim 13, wherein the dopants doped into the substrate are Cu and I.

16. An LED as claimed in claim 13, wherein the dopants doped into the substrate are Ag and I.

17. An LED as claimed in claim 1, wherein the substrate is an n-type or a p-type GaN substrate doped with O, C or N-vacancy without a sapphire base and the active layer is a GaInN layer.

18. An LED as claimed in claim 17, wherein the light from the active layer has a wavelength from 400 nm to 510 nm, the fluorescence from the substrate has a wavelength from 520 nm to 650 nm and white color light is synthesized by the light from the active layer and the fluorescence from the substrate.

19. An LED as claimed in claim 18, wherein the active layer is denoted as $Ga_{1-x}IN_xN$ with a ratio x and tone of the white color is changed by varying the ratio x.

20. An LED as claimed in claim 18, wherein tone of the white color is changed by varying the thickness of the substrate from 50 μm to 2 mm.

* * * * *